US008316618B1

(12) United States Patent
Rodowca et al.

(10) Patent No.: US 8,316,618 B1
(45) Date of Patent: *Nov. 27, 2012

(54) INTEGRATED PHOTOVOLTAIC ROOFTOP MODULES

(75) Inventors: Jerrod Quinton Rodowca, Tucson, AZ (US); Ronald L. Starjnski, Tucson, AZ (US); David Rego, Marana, AZ (US); Ben Michael Striner, Tucson, AZ (US); Benjamin William Schams, Tucson, AZ (US); John W. Rethans, San Carlos, CA (US); William Richardson, Tucson, AZ (US)

(73) Assignee: SOLON Corporation, Tucson, AZ (US)

(*) Notice: Subject to any disclaimer, the term of this patent is extended or adjusted under 35 U.S.C. 154(b) by 0 days.

This patent is subject to a terminal disclaimer.

(21) Appl. No.: 13/480,237

(22) Filed: May 24, 2012

Related U.S. Application Data

(60) Provisional application No. 61/505,463, filed on Jul. 7, 2011, provisional application No. 61/535,593, filed on Sep. 16, 2011, provisional application No. 61/547,589, filed on Oct. 14, 2011, provisional application No. 61/587,454, filed on Jan. 17, 2012.

(51) Int. Cl.
*E04B 1/00* (2006.01)
*E04D 13/18* (2006.01)
(52) U.S. Cl. ...... 52/747.1; 52/173.3; 136/244; 126/621; 126/623
(58) Field of Classification Search ............... 52/173.3; 126/621, 622, 623; 136/244, 251, 291; 403/167, 403/168, 294, 306
See application file for complete search history.

(56) References Cited

U.S. PATENT DOCUMENTS

| | | | |
|---|---|---|---|
| 1,349,908 A | 8/1920 | Post et al. |
| 3,094,303 A | 6/1963 | Belger |
| 3,116,171 A | 12/1963 | Nielsen et al. |
| 3,171,403 A | 3/1965 | Drescher |
| 3,292,306 A | 12/1966 | Carlson |
| 3,411,952 A | 11/1968 | Ross et al. |
| 3,415,475 A | 12/1968 | Goodman |
| 3,457,427 A | 7/1969 | Tarneja et al. |
| 3,565,719 A | 2/1971 | Webb |
| 3,709,583 A | 1/1973 | Pfannkuch et al. |
| 3,742,659 A | 7/1973 | Drew |
| 3,980,071 A | 9/1976 | Barber, Jr. |
| 3,988,166 A | 10/1976 | Beam |

(Continued)

FOREIGN PATENT DOCUMENTS

CN 102005484 A 4/2011

(Continued)

OTHER PUBLICATIONS

Russell et al. of Ascension Technology, Inc., "PV Array Designs for Flat-Roof Buildings", article, 1993, pp. 1129-1133 (submitted as Exhibit 4 in USDC Case No. 4:08-cv-02807-SBA, filed Jan. 21, 2009).

(Continued)

*Primary Examiner* — William Gilbert
*Assistant Examiner* — Patrick Maestri
(74) *Attorney, Agent, or Firm* — Kolisch Hartwell, P.C.

(57) ABSTRACT

Photovoltaic modules including a solar panel integrated with a supporting frame, and which are configured to be installed on a building rooftop. Modules according to the present teachings may be at least partially pre-assembled, with a solar panel oriented at a predetermined angle relative to the rooftop mounting surface of the supporting frame.

20 Claims, 15 Drawing Sheets

U.S. PATENT DOCUMENTS

| | | | |
|---|---|---|---|
| 3,990,762 A | 11/1976 | Lemesle | |
| 4,004,574 A | 1/1977 | Barr | |
| 4,015,366 A | 4/1977 | Hall, III | |
| 4,019,924 A | 4/1977 | Kurth | |
| 4,025,786 A | 5/1977 | Hamilton | |
| 4,031,385 A | 6/1977 | Zerlaut et al. | |
| 4,040,867 A | 8/1977 | Forestieri et al. | |
| 4,045,934 A | 9/1977 | Sheahan et al. | |
| 4,063,963 A | 12/1977 | Bond, Jr. | |
| 4,074,705 A | 2/1978 | Robinson, Jr. et al. | |
| 4,083,360 A | 4/1978 | Courvoisier et al. | |
| 4,086,599 A | 4/1978 | VanderLinden, Jr. et al. | |
| 4,108,154 A | 8/1978 | Nelson | |
| 4,132,570 A | 1/1979 | Caruso et al. | |
| 4,137,097 A | 1/1979 | Kelly | |
| 4,137,897 A | 2/1979 | Moore | |
| 4,147,154 A | 4/1979 | Lewandowski | |
| 4,148,297 A | 4/1979 | Sherman, Jr. | |
| 4,148,298 A | 4/1979 | Sherman, Jr. | |
| 4,148,299 A | 4/1979 | Sherman, Jr. | |
| 4,154,221 A | 5/1979 | Nelson | |
| 4,165,853 A | 8/1979 | Brandt | |
| 4,191,794 A | 3/1980 | Shirland et al. | |
| 4,204,523 A | 5/1980 | Rothe | |
| 4,217,887 A | 8/1980 | Hoffman et al. | |
| 4,223,214 A | 9/1980 | Dorian et al. | |
| 4,225,781 A | 9/1980 | Hammons | |
| 4,226,256 A | 10/1980 | Hawley | |
| 4,237,863 A | 12/1980 | Harrison | |
| 4,238,912 A | 12/1980 | MacDonald | |
| 4,241,727 A | 12/1980 | Toti | |
| 4,245,895 A | 1/1981 | Wildenrotter | |
| 4,250,606 A | 2/1981 | Korenaga | |
| 4,261,613 A | 4/1981 | Alford | |
| 4,265,221 A | 5/1981 | Whinnery | |
| 4,265,422 A | 5/1981 | Van Leeuwen | |
| 4,266,530 A | 5/1981 | Steadman | |
| 4,269,173 A | 5/1981 | Krueger et al. | |
| 4,271,103 A | 6/1981 | McAlister | |
| 4,291,000 A | 9/1981 | Swales et al. | |
| 4,295,621 A | 10/1981 | Siryj | |
| 4,309,857 A | 1/1982 | Lovering | |
| 4,326,843 A | 4/1982 | Smith | |
| 4,336,413 A | 6/1982 | Tourneux | |
| 4,344,479 A | 8/1982 | Bailey | |
| 4,345,587 A | 8/1982 | Carvalho | |
| RE31,023 E | 9/1982 | Hall, III | |
| 4,371,139 A | 2/1983 | Clark | |
| 4,389,826 A | 6/1983 | Kelly | |
| RE31,321 E | 7/1983 | Harrison | |
| 4,392,009 A | 7/1983 | Napoli | |
| 4,416,618 A | 11/1983 | Smith | |
| 4,421,943 A | 12/1983 | Withjack | |
| 4,429,178 A | 1/1984 | Prideaux et al. | |
| 4,429,952 A | 2/1984 | Dominguez | |
| 4,476,853 A | 10/1984 | Arbogast | |
| 4,502,467 A | 3/1985 | Smith | |
| 4,527,544 A | 7/1985 | Wolf et al. | |
| 4,611,090 A | 9/1986 | Catella et al. | |
| 4,620,397 A | 11/1986 | Simpson et al. | |
| 4,620,771 A | 11/1986 | Dominguez | |
| 4,636,577 A | 1/1987 | Peterpaul | |
| 4,649,675 A | 3/1987 | Moldovan et al. | |
| 4,677,248 A | 6/1987 | Lacey | |
| 4,712,338 A | 12/1987 | Trickel | |
| 4,718,404 A | 1/1988 | Sadler | |
| RE32,607 E | 2/1988 | Smith | |
| 4,724,010 A | 2/1988 | Okaniwa et al. | |
| 4,749,675 A | 6/1988 | Olivier et al. | |
| 4,788,904 A | 12/1988 | Radtke | |
| 4,799,642 A | 1/1989 | Wright | |
| 4,860,509 A | 8/1989 | Laaly et al. | |
| 4,871,917 A | 10/1989 | O'Farrell et al. | |
| 4,905,579 A | 3/1990 | Dame | |
| 4,922,264 A | 5/1990 | Fitzgerald et al. | |
| 4,936,063 A | 6/1990 | Humphrey | |
| 4,966,631 A | 10/1990 | Matlin et al. | |
| 5,031,374 A | 7/1991 | Batch et al. | |
| 5,092,939 A | 3/1992 | Nath et al. | |
| 5,125,608 A | 6/1992 | McMaster et al. | |
| 5,142,293 A | 8/1992 | Ross | |
| 5,164,020 A | 11/1992 | Wagner et al. | |
| 5,228,924 A | 7/1993 | Barker et al. | |
| 5,232,518 A | 8/1993 | Nath et al. | |
| 5,252,141 A | 10/1993 | Inoue et al. | |
| 5,288,619 A | 2/1994 | Brown et al. | |
| 5,316,592 A | 5/1994 | Dinwoodie | |
| 5,409,549 A | 4/1995 | Mori | |
| 5,505,788 A | 4/1996 | Dinwoodie | |
| 5,694,774 A | 12/1997 | Drucker | |
| 5,702,149 A | 12/1997 | Sweeney | |
| 5,741,370 A | 4/1998 | Hanoka | |
| 5,746,839 A | 5/1998 | Dinwoodie | |
| 5,762,720 A | 6/1998 | Hanoka et al. | |
| D408,554 S | 4/1999 | Dinwoodie | |
| 5,983,634 A | 11/1999 | Drucker | |
| 5,986,203 A | 11/1999 | Hanoka et al. | |
| 6,021,862 A | 2/2000 | Sharan | |
| 6,061,978 A | 5/2000 | Dinwoodie et al. | |
| 6,148,570 A | 11/2000 | Dinwoodie et al. | |
| 6,295,818 B1 | 10/2001 | Ansley et al. | |
| 6,313,394 B1 | 11/2001 | Shugar et al. | |
| D453,727 S | 2/2002 | Shugar et al. | |
| 6,495,750 B1 | 12/2002 | Dinwoodie | |
| 6,501,013 B1 | 12/2002 | Dinwoodie | |
| D471,855 S | 3/2003 | Shugar et al. | |
| 6,534,703 B2 | 3/2003 | Dinwoodie | |
| 6,570,084 B2 | 5/2003 | Dinwoodie | |
| 6,586,668 B2 | 7/2003 | Shugar et al. | |
| 6,675,580 B2 | 1/2004 | Ansley et al. | |
| 6,702,370 B2 | 3/2004 | Shugar et al. | |
| 6,809,251 B2 | 10/2004 | Dinwoodie | |
| 6,809,253 B2 | 10/2004 | Dinwoodie | |
| 6,883,290 B2 | 4/2005 | Dinwoodie | |
| D510,315 S | 10/2005 | Shugar et al. | |
| D511,576 S | 11/2005 | Shingleton et al. | |
| RE38,988 E | 2/2006 | Dinwoodie | |
| 7,178,295 B2 | 2/2007 | Dinwoodie | |
| 7,260,918 B2 | 8/2007 | Liebendorfer | |
| 7,328,534 B2 | 2/2008 | Dinwoodie | |
| 7,406,800 B2 | 8/2008 | Cinnamon et al. | |
| 7,434,362 B2 | 10/2008 | Liebendorfer | |
| 7,487,771 B1 | 2/2009 | Eiffert et al. | |
| 7,557,292 B2 | 7/2009 | Shingleton et al. | |
| 7,600,349 B2 | 10/2009 | Liebendorfer | |
| 7,748,175 B2 | 7/2010 | Liebendorfer | |
| 7,766,292 B2 | 8/2010 | Liebendorfer | |
| 7,807,918 B2 | 10/2010 | Shingleton et al. | |
| 7,810,286 B2 | 10/2010 | Eiffert et al. | |
| 7,866,098 B2 | 1/2011 | Cinnamon | |
| 7,888,587 B2 | 2/2011 | Shingleton et al. | |
| 8,061,091 B2 | 11/2011 | Botkin et al. | |
| 2001/0039960 A1 | 11/2001 | Shugar et al. | |
| 2002/0046764 A1 | 4/2002 | Ansley et al. | |
| 2002/0174889 A1 | 11/2002 | Shugar et al. | |
| 2003/0010372 A1 | 1/2003 | Dinwoodie | |
| 2003/0010374 A1 | 1/2003 | Dinwoodie | |
| 2003/0010375 A1 | 1/2003 | Dinwoodie | |
| 2003/0015636 A1 | 1/2003 | Liebendorfer | |
| 2003/0015637 A1 | 1/2003 | Liebendorfer | |
| 2003/0154666 A1 | 8/2003 | Dinwoodie | |
| 2003/0154667 A1 | 8/2003 | Dinwoodie | |
| 2003/0154680 A1 | 8/2003 | Dinwoodie | |
| 2003/0164187 A1 | 9/2003 | Dinwoodie | |
| 2003/0222479 A1 | 12/2003 | Shugar et al. | |
| 2004/0007260 A1 | 1/2004 | Dinwoodie | |
| 2004/0163338 A1 | 8/2004 | Liebendorfer | |
| 2004/0261955 A1 | 12/2004 | Shingleton et al. | |
| 2005/0109384 A1 | 5/2005 | Shingleton et al. | |
| 2005/0126621 A1 | 6/2005 | Dinwoodie et al. | |
| 2005/0144870 A1 | 7/2005 | Dinwoodie | |
| 2005/0257453 A1 | 11/2005 | Cinnamon | |
| 2006/0196128 A1 | 9/2006 | Duke | |
| 2006/0225780 A1 | 10/2006 | Johnson, III et al. | |
| 2007/0144575 A1 | 6/2007 | Mascolo et al. | |
| 2007/0151594 A1 | 7/2007 | Mascolo et al. | |
| 2007/0295392 A1 | 12/2007 | Cinnamon | |

| | | | |
|---|---|---|---|
| 2007/0295393 A1 | 12/2007 | Cinnamon | |
| 2008/0010915 A1 | 1/2008 | Liebendorfer | |
| 2008/0029148 A1* | 2/2008 | Thompson | 136/244 |
| 2008/0072951 A1 | 3/2008 | Gabor | |
| 2008/0149170 A1 | 6/2008 | Hanoka | |
| 2009/0019796 A1 | 1/2009 | Liebendorfer | |
| 2009/0078299 A1 | 3/2009 | Cinnamon et al. | |
| 2009/0104399 A1 | 4/2009 | Field | |
| 2009/0113822 A1 | 5/2009 | Patrina et al. | |
| 2009/0134291 A1 | 5/2009 | Meier et al. | |
| 2009/0223142 A1 | 9/2009 | Shingleton et al. | |
| 2009/0242014 A1 | 10/2009 | Leary | |
| 2009/0266406 A1 | 10/2009 | Duke et al. | |
| 2009/0320906 A1 | 12/2009 | Botkin et al. | |
| 2010/0089389 A1 | 4/2010 | Seery et al. | |
| 2010/0089390 A1 | 4/2010 | Miros et al. | |
| 2010/0179678 A1 | 7/2010 | Dinwoodie et al. | |
| 2010/0219304 A1 | 9/2010 | Miros et al. | |
| 2010/0243023 A1 | 9/2010 | Patton et al. | |
| 2010/0263297 A1 | 10/2010 | Liebendorfer | |
| 2010/0269447 A1 | 10/2010 | Schuit et al. | |
| 2010/0275974 A1 | 11/2010 | Chan et al. | |
| 2010/0293874 A1 | 11/2010 | Liebendorfer | |
| 2010/0319277 A1 | 12/2010 | Suarez et al. | |
| 2011/0024582 A1 | 2/2011 | Gies et al. | |
| 2011/0067327 A1 | 3/2011 | Eiffert et al. | |
| 2011/0088740 A1 | 4/2011 | Mittan et al. | |

FOREIGN PATENT DOCUMENTS

| | | | |
|---|---|---|---|
| DE | 2819901 A1 | 11/1979 | |
| DE | 7913751 U1 | 8/1982 | |
| DE | 3611542 A1 | 10/1987 | |
| DE | 102009051756 A1 | 1/2011 | |
| EP | 1602133 B1 | 7/2008 | |
| EP | 1665393 B1 | 5/2009 | |
| EP | 2056359 A2 | 5/2009 | |
| EP | 0991827 B1 | 3/2011 | |
| EP | 1476617 B1 | 7/2011 | |
| EP | 1412988 B1 | 8/2011 | |
| EP | 1476614 B1 | 4/2012 | |
| FR | 2451654 A1 | 10/1980 | |
| GB | 1564887 A | 4/1980 | |
| GB | 2145385 A | 3/1985 | |
| GB | 2253379 A | 9/1992 | |
| JP | 2006157055 A | 6/2006 | |
| JP | 2009224807 A | 10/2009 | |
| JP | 2010163862 A | 2/2012 | |
| WO | 8000035 A1 | 1/1980 | |
| WO | 8000368 A1 | 3/1980 | |
| WO | 9003663 A1 | 4/1990 | |
| WO | 9202699 A1 | 2/1992 | |
| WO | 9400650 A1 | 1/1994 | |
| WO | 9600827 A1 | 1/1996 | |
| WO | 9738185 A1 | 10/1997 | |
| WO | 9829648 A1 | 7/1998 | |
| WO | 9859122 A2 | 12/1998 | |
| WO | 9947809 A1 | 9/1999 | |
| WO | 0046056 A1 | 8/2000 | |
| WO | 0101498 A1 | 1/2001 | |
| WO | 0216707 A1 | 2/2002 | |
| WO | 03007388 A1 | 1/2003 | |
| WO | 03017380 A1 | 2/2003 | |
| WO | 03017381 A1 | 2/2003 | |
| WO | 03041180 A1 | 5/2003 | |
| WO | 03071047 A2 | 8/2003 | |
| WO | 03071054 A1 | 8/2003 | |
| WO | 03072891 A1 | 9/2003 | |
| WO | 2004081306 A2 | 9/2004 | |
| WO | 2005020290 A2 | 3/2005 | |
| WO | 2007076519 A2 | 7/2007 | |

OTHER PUBLICATIONS

Peter Toggweiler of PMS Energie AG Mönchaltrorf, "Development of a flat roof integrated photovoltaic system", Sofrel R&D Project (Solar Flat Roof Element) research paper, Mar. 1994, 187 pages (submitted as Exhibit 6 in USDC Case No. 4:08-cv-02807-SBA, filed Jan. 21, 2009).

Sep. 6, 2012, Office Action from US Patent and Trademark Office, in U.S. Appl. No. 13/480,248, which is a related application to this U.S. application.

Sep. 6, 2012, Office Action from US Patent and Trademark Office, in U.S. Appl. No. 13/480,250, which is a related application to this U.S. application.

* cited by examiner

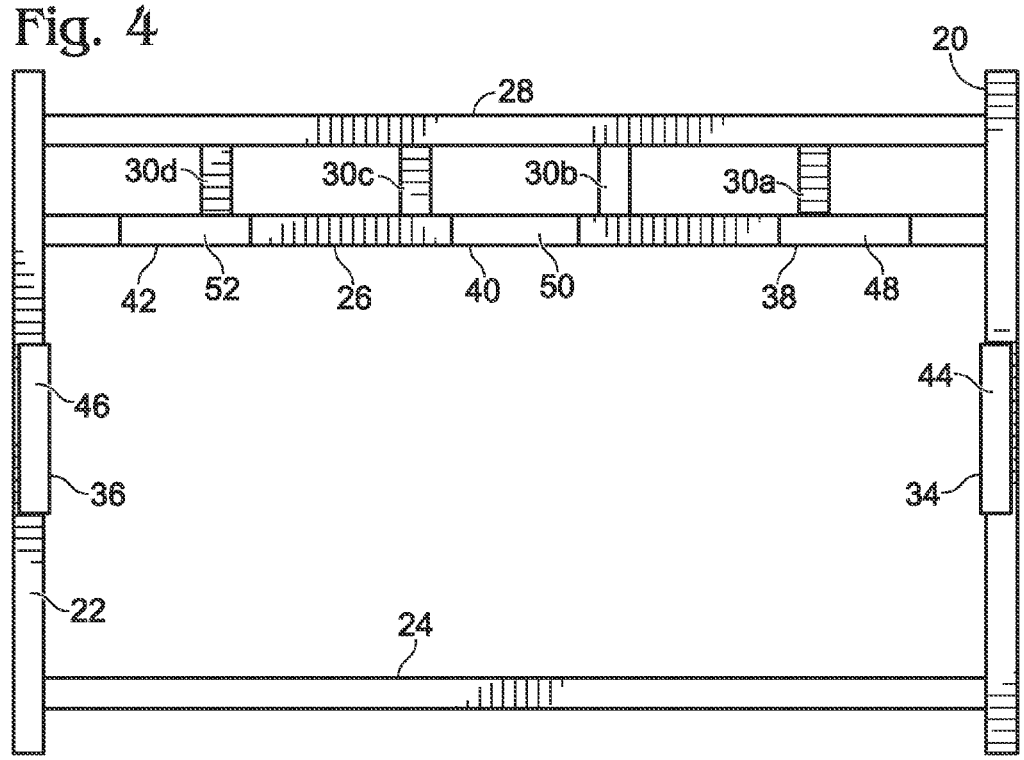
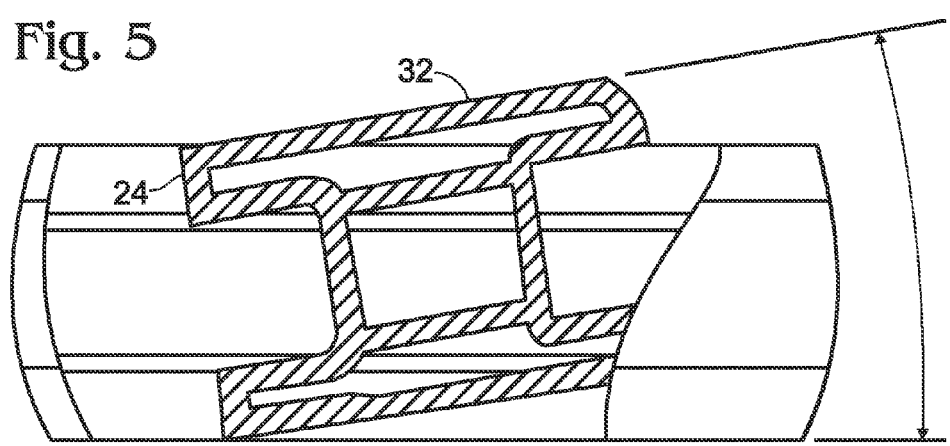

INTEGRATED PHOTOVOLTAIC ROOFTOP MODULES

CROSS-REFERENCE TO RELATED APPLICATIONS

The present application claims priority to the following U.S. provisional patent applications: application No. 61/505,463 filed Jul. 7, 2011, application No. 61/535,593 filed Sep. 16, 2011, application No. 61/547,589 filed Oct. 14, 2011, and application No. 61/587,454 filed Jan. 17, 2012. These applications are hereby incorporated by reference into the present disclosure for all purposes.

INTRODUCTION

Solar, or photovoltaic (PV), panels have been used for decades to create usable electrical power by harnessing the sun's energy. PV panels are usually mounted in suitable locations for maximum exposure to the sun. Frequently, these locations include building rooftops, both industrial and residential. Accordingly, various methods and devices have been developed for mounting PV panels on the roofs of buildings.

The terms "solar panels," "photovoltaic panels," and "PV panels," as used in this disclosure, include all types of photovoltaic material suitable for mounting in a generally planar orientation. For example, solar panels suitable for use with the present teachings include those constructed from both thin-film flexible PV material, such as material incorporating copper indium gallium diselenide (CIGS) type semiconductors, and also panels based on more rigid PV material such as crystalline silicon.

Solar panels are typically sold separately from the racks or mounting structures used to install them on a building rooftop. This situation often requires a user to acquire custom-built rack mounting solutions with accompanying high installation costs. One-size-fits-all rack mounting systems are available. However, those systems tend to be complex, heavy, require multiple roof penetrations, and employ metal construction requiring extensive grounding. Existing systems also tend to require assembly by skilled workers and/or the use of one or more tools. Exemplary existing systems are described, for example, in U.S. Pat. Nos. 4,371,139, 5,228,924, 5,505,788, 5,746,839 (reissued as RE038988), 6,495,750, 6,501,013, 6,534,703, 6,570,084, 6,809,251, 6,809,253, and 7,814,899, each of which is hereby incorporated by reference into the present disclosure for all purposes.

Therefore, it is desirable to provide a rooftop PV mounting system that is lightweight, easily transported, and easily installed.

SUMMARY

The present teachings disclose improved PV modules and assemblies of modules, including apparatus, methods of use, and methods of manufacture. The disclosed assemblies generally include a solar panel integrated with a supporting frame, and are configured to be installed on a building rooftop. Modules according to the present teachings may be at least partially pre-assembled, with a solar panel oriented at a predetermined angle relative to the rooftop mounting surface of the supporting frame.

BRIEF DESCRIPTION OF THE DRAWINGS

FIG. 4 is a top view of the frame shown in FIG. 2.

FIG. 5 is a semi-transparent, magnified sectional view of a portion of the frame shown in FIG. 2.

DETAILED DESCRIPTION

The present teachings describe improved photovoltaic modules and assemblies of modules, including apparatus, methods of use, and methods of manufacture. The disclosed assemblies generally include a solar panel integrated with a supporting frame, and are configured to be installed on a building rooftop. Modules according to the present teachings may be at least partially pre-assembled, with a solar panel oriented at a predetermined angle relative to the rooftop mounting surface of the supporting frame. Modules according to the present teachings also may be connected together, both mechanically and electrically, to form assemblies of photovoltaic modules in an improved manner.

I. Modules and Assemblies of Modules

This section describes photovoltaic modules and assemblies of multiple photovoltaic modules according to aspects of the present teachings; see FIGS. 1A-20.

Figure 1A:
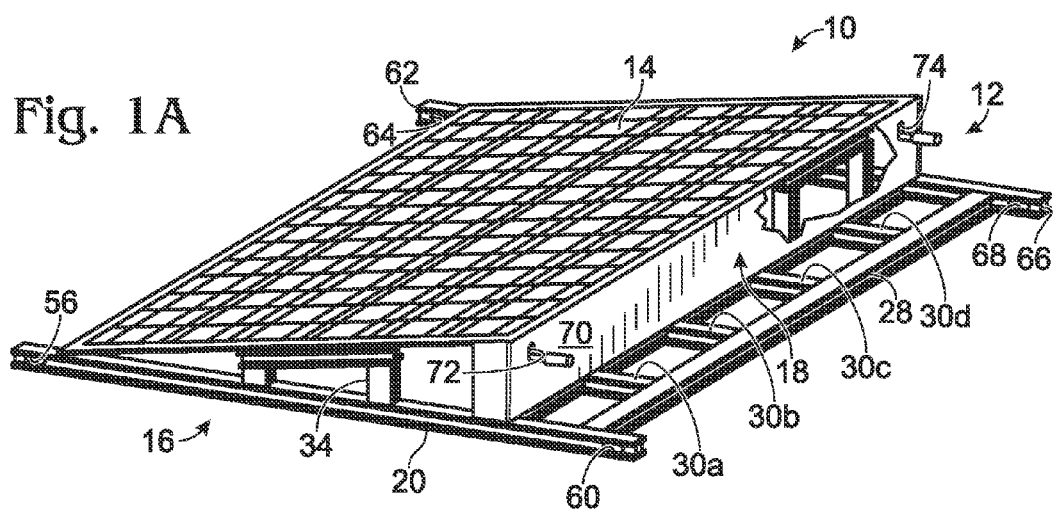
FIG. 1A is an isometric view of a photovoltaic module, according to aspects of the present teachings.

FIG. 1A is an isometric view depicting a photovoltaic module, generally indicated at 10, according to aspects of the present teachings. Module 10 includes a frame generally indicated at 12, and a photovoltaic panel 14 mounted upon or otherwise attached to the frame. As described previously, photovoltaic panel 14 is not limited to any particular type of photovoltaic material. Nonexclusive examples of suitable materials for use in conjunction with the present teachings include flexible, thin-film, CIGS-based materials, and more rigid, crystalline silicon-based materials.

Figure 3:
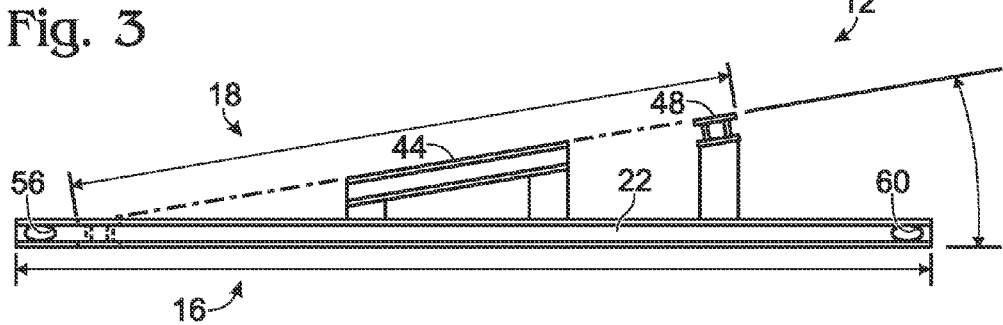
FIG. 3 is a left side elevational view of the frame shown in FIG. 2.
Figure 2:
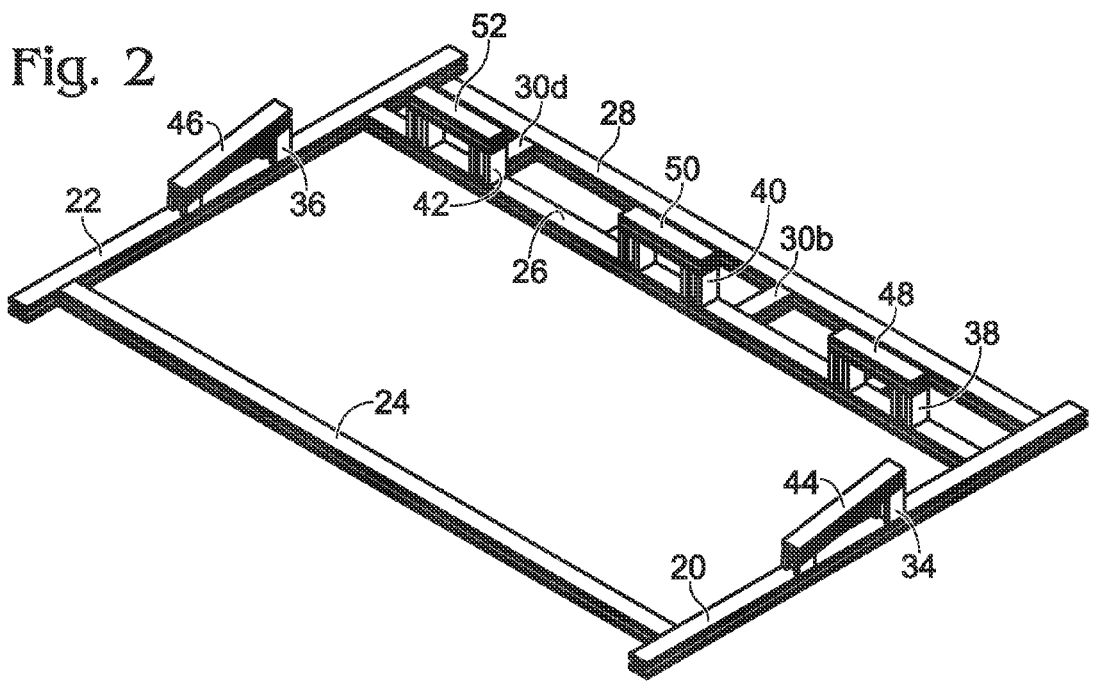
FIG. 2 shows a frame portion of the module of FIG. 1.

FIGS. 2-4 respectively depict an isometric view, a side elevational view, and a top view of frame 12. As indicated particularly in FIG. 3, frame 12 can be thought of as including a first, lower frame portion generally indicated at 16, and a second, upper frame portion generally indicated at 18. However, the distinction between the first and second frame portions is made only for convenience in describing frame 12 below in greater detail. All of the various parts of frame 12, including the first and second frame portions, will typically be joined together securely, for example by heat welding.

Lower frame portion 16 includes left and right side members 20 and 22, a front cross member 24 connecting the left and right side members, and a first rear cross member 26 also connecting the left and right side members. A second rear cross member 28 and several ballast support members 30a, 30b, 30c and 30d also may form parts of lower frame portion 16. The bottom surface of lower frame portion 16 defines a plane, so that when frame 12 is placed on a substantially planar building rooftop or any other substantially planar surface, the bottom surface of frame portion 16 will make contact with the planar rooftop surface, providing stability to the frame.

FIG. 5 depicts a magnified side sectional view of a portion of frame 12, showing that front cross member 24 may be oriented at an angle relative to the other parts of lower frame portion 16. In this case, front cross member 24 may not help to form the bottom surface of lower frame portion 16, but rather may have at least a top surface 32 which is angled relative to the plane defined by the bottom surface of lower frame portion 16. As will be described in more detail below, front cross member 24 may be oriented in this manner to help support photovoltaic panel 14.

In the embodiment depicted in FIGS. 1-5, upper frame portion 18 includes left and right support members 34 and 36, and rear support members 38, 40 and 42. In the depicted embodiment, left and right support members 34 and 36 are each connected to a respective one of left and right side members 20 and 22, whereas rear support members 38, 40 and 42 are each connected to rear cross member 26. Other embodiments according to the present teachings may include a greater or lesser number of support members, and in some cases may include left and right support members but no rear support members, or may include one or more rear support members but no left or right support members.

In any case, the second or upper frame portion 18 defines a second plane, which is oriented at a predetermined, nonzero angle relative to the plane defined by the bottom surface of frame 12. More specifically, each of left and right support members 34 and 36 includes an upper surface shown respectively at 44 and 46, lying substantially within and thereby helping to define the second plane. Similarly, each of rear support members 38, 40 and 42 includes an upper surface shown respectively at 48, 50 and 52, also angled to lie substantially within and thereby helping to define the second plane. These rear support members are configured to at least partially support the photovoltaic panel disposed on top of the frame.

As discussed previously and depicted in FIG. 5, front cross member 24 may have a top surface 32 which is angled relative to the plane defined by the bottom surface of lower frame portion 16. This angle is chosen so that top surface 32 also lies within and helps to define the second plane. Accordingly, photovoltaic panel 14 of module 10 is supported by upper surface 32 of front cross member 24, upper surfaces 44 and 46 of the left and right support members, and/or upper surfaces 48, 50 and 52 of the rear support members, all of which lie within and define a common plane within which photovoltaic panel 14 of module 10 is mounted. In other words, photovoltaic panel 14 lies substantially within the second plane defined by the second or upper frame portion.

While the preceding description refers to a single, predetermined angle between the plane defined by the bottom of the module frame and the plane defined by the top supporting surface of the module frame (and thus between the rooftop or other supporting surface and the photovoltaic panel), the present teachings are not restricted to this possibility. Rather, referring to the plane defined by the bottom of the frame as the "first plane" and the plane defined by the top supporting surface of the frame as the "second plane," in some cases the angle between the first plane and the second plane may be predetermined to have a single value (as shown in FIGS. 1-7), but in other cases (not shown) the angle between the first plane and the second plane may be selectable within a predetermined continuous range, and in still other cases (also not shown) the angle between the first plane and the second plane may be selectable within predetermined discrete values.

Figure 6:
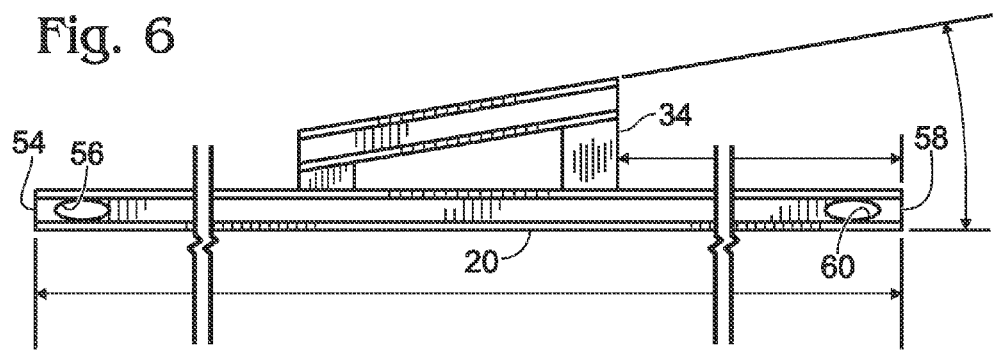
FIG. 6 is a magnified left side elevational view of portions of the frame shown in FIG. 2.

FIG. 6 is a magnified side elevational view depicting portions of left side member 20 and left support member 34. As FIG. 6 depicts, the side members may include various connection apertures configured to receive a connecting member for securely attaching the module to an adjacent, substantially similar module. Specifically, left side member 20 includes a leading edge 54, a front aperture 56 disposed near the leading edge, a trailing edge 58, and a rear aperture 60 disposed near the trailing edge. Similarly, as can be seen, for example, in FIG. 1A, right side member 22 includes a leading edge 62, a front aperture 64 disposed near the leading edge, a trailing edge 66, and a rear aperture 68 disposed near the trailing edge. Each leading edge is configured to be connected to a leading edge of a laterally adjacent module and a trailing edge of a longitudinally adjacent module, and each trailing edge is configured to be connected to a trailing edge of a laterally adjacent module and a leading edge of a longitudinally adjacent module. The manner in which these edges and apertures may be used to join two or more modules together mechanically, to form a photovoltaic assembly, will now be described in more detail.

Figure 7:
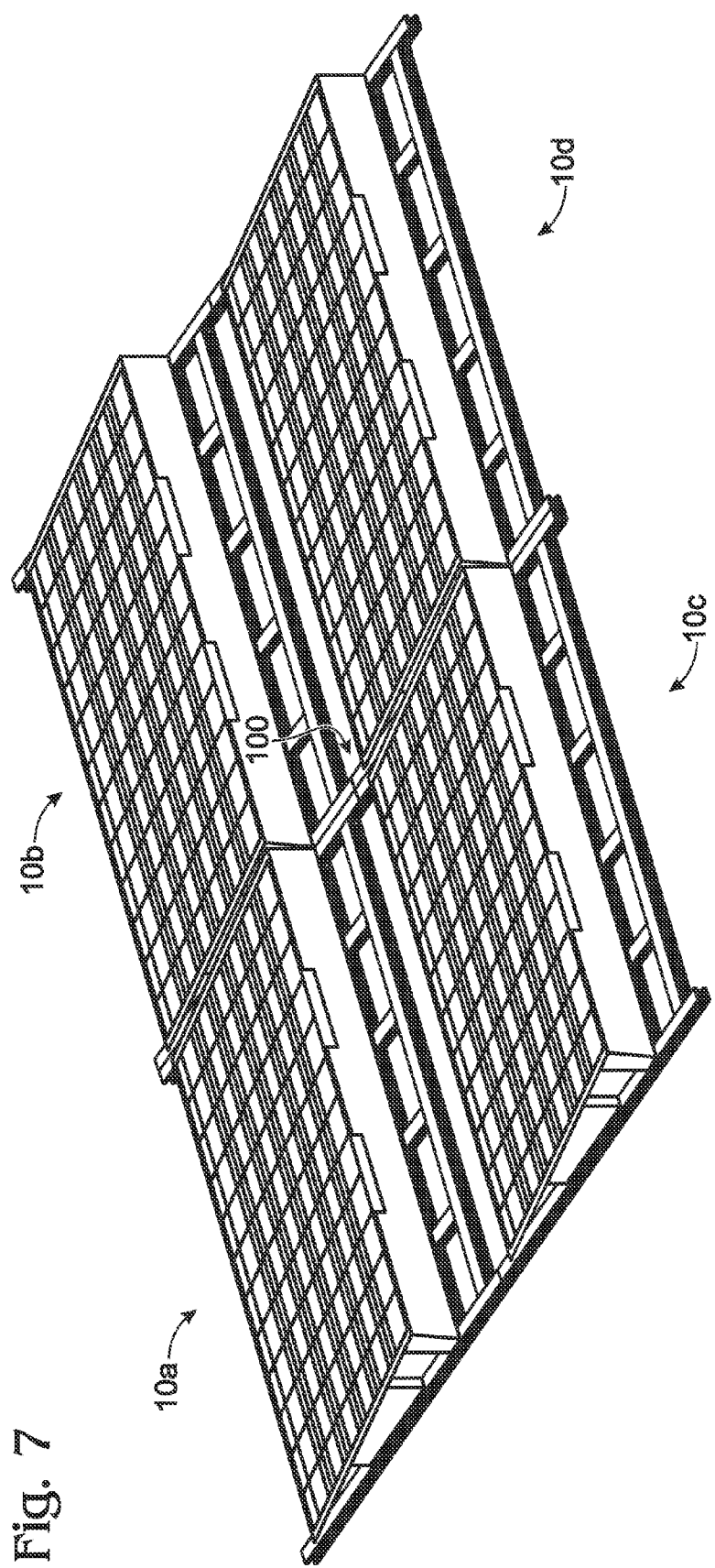
FIG. 7 is an isometric view showing an assembly of four adjacent photovoltaic modules, according to aspects of the present teachings.

More specifically, the front and rear apertures of each side member are configured to receive a connection member for securing module 10 to an adjacent, substantially similar module. For example, FIG. 7 depicts four adjacent modules 10a, 10b, 10c and 10d, each of which are substantially similar or identical to module 10 described previously. Accordingly, reference numbers followed by "a," "b," "c" or "d" should be understood to represent components of modules 10a, 10b, 10c or 10d which are substantially similar to their counterparts in module 10.

Modules 10a, 10b, 10c and 10d are disposed adjacent to each other. More specifically, module 10b is disposed laterally adjacent to and longitudinally aligned with module 10a, module 10c is disposed longitudinally adjacent to and laterally aligned with module 10a, and module 10d is disposed laterally adjacent to and longitudinally aligned with module 10c, and is therefore longitudinally adjacent to and laterally aligned with module 10b. As described in more detail below, the modules are joined together at least at a central intersection region, generally indicated at 100.

Figure 8:
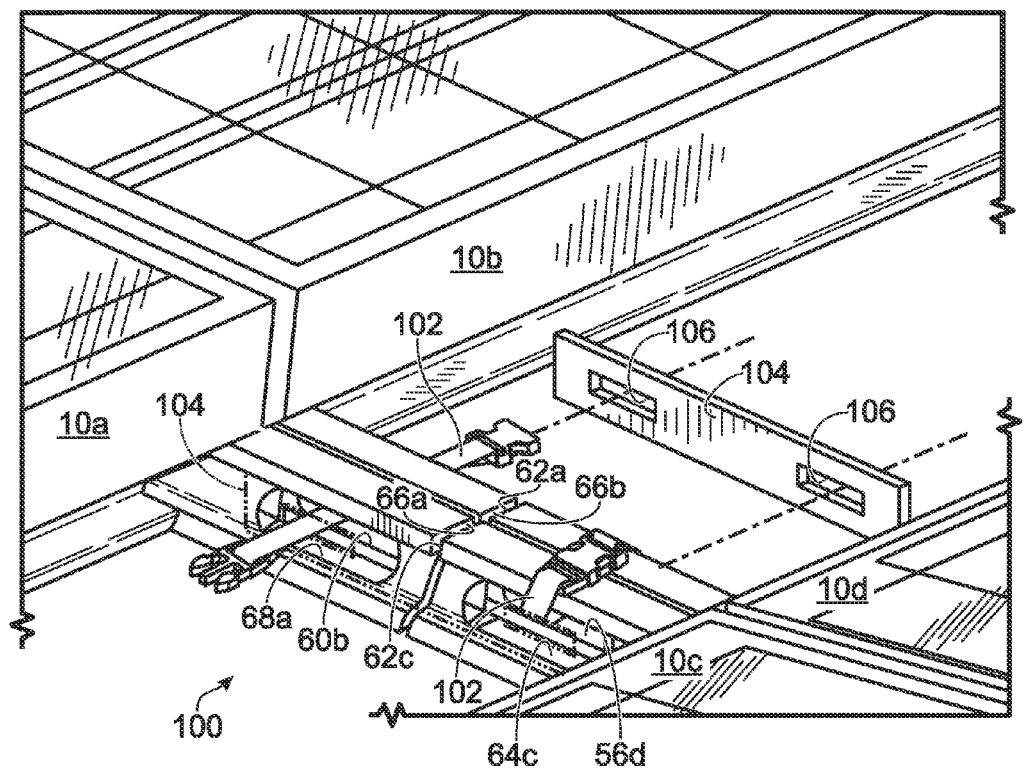
FIG. 8 is a magnified view of a central portion of the assembly of modules shown in FIG. 7, also showing a connection member in the form of a strap that may be used to connect the modules together.

FIG. 8 is a close-up view of intersection region 100, showing a pair of connection members 102 in the form of self-connecting straps that may be passed through adjacent apertures of modules 10a, 10b, 10c and 10d. Although connection member 102 is depicted as an adjustable strap, other types of connection members are within the scope of the present teachings, including other flexible and/or elastic connection members that may be formed into closed loops, and also including more rigid, multi-piece connection members that may be inserted through apertures of adjacent modules and then fastened together to connect the modules.

In FIG. 8, modules 10a, 10b, 10c and 10d are secured together with a first connection member or strap 102 passing through right rear aperture 68a of module 10a and left rear aperture 60b of module 10b, which is laterally adjacent to right rear aperture 68a of module 10a. A second connection member or strap 102 passes through right front aperture 64c of module 10c, which is longitudinally adjacent to right rear aperture 68a of module 10a, and left front aperture 56d of module 10d, which is laterally adjacent to right front aperture 64c of module 10c and longitudinally adjacent to left rear aperture 60b of module 10b.

As depicted in FIG. 8, each strap 102 also passes through an aperture 106 in a joining member 104 disposed on each side of intersection region and spanning the leading and trailing edges of the adjacent modules. The joining members are disposed adjacent to the side members of the modules, with their apertures aligned with the apertures of the side members. Straps 102 are then each formed into a loop, for example by buckling their two ends together, and tightened to connect the modules to each other securely.

In some cases, connecting members such as straps, rigid connecting members and/or the like may be used to connect fewer than four adjacent modules together. For example, referring again to FIG. 7, a connecting member may pass through the trailing edge connection aperture of the left side member of module 10a and the leading edge connection aperture of the left side member of module 10c, and another connecting member may pass through the trailing edge connection aperture of the right side member of module 10b and the leading edge connection aperture of the right side member of module 10d. In like manner, any number of laterally aligned and longitudinally adjacent modules may be connected with connecting members passing through the trailing edge connection apertures of the front module, and the leading edge connection apertures of the rear module.

Similarly, yet another connecting member may pass through the leading edge connection apertures of the right side member of module 10a and the left side member of module 10b, and still another connecting member may pass through the trailing edge connection apertures of the right side member of module 10c and the left side member of module 10d. In like manner, any number of longitudinally aligned and laterally adjacent modules may be connected with a first connecting member passing through the trailing edge connection apertures of the adjacent modules, and/or a second connecting member passing through the leading edge connection apertures of the adjacent modules. Furthermore, the foregoing discussion should make it apparent that for the assembly of four modules depicted in FIG. 7, as many as five separate connecting members may be used to connect the adjacent modules into a stable configuration. Greater or fewer numbers of connecting members may be used in assemblies having different numbers of modules.

Referring again to FIG. 8, trailing edge 66a of module 10a is depicted as angled slightly backward (toward module 10a) from top to bottom, and leading edge 62c of module 10c is depicted as angled slightly forward (away from module 10c) from top to bottom. Specifically, each leading edge defines a leading edge plane angled at a non-perpendicular angle relative to the plane of the bottom portions of the module frames, and each trailing edge defines a trailing edge plane angled at 180 degrees minus the angle of the leading edge plane relative to the first plane. Accordingly, trailing edge 66a and leading edge 62c are configured to mate or register together when module 10a and module 10c are placed longitudinally adjacent to each other.

More generally, the leading edge of each side member may be constructed with a shape complementary to a shape of the trailing edge of each side member, so that each pair of modules will become registered when the modules of the pair are placed longitudinally adjacent to each other. Similarly, the lateral side portions of left and right side members may be constructed with complementary shapes (not shown), to facilitate positioning of laterally adjacent modules.

As can be seen, for example, in FIG. 1A, module 10 of the depicted embodiment also includes a rear wind deflector 70, attached to rear cross member 26. The wind deflector depicted in FIG. 1A is mounted substantially perpendicularly with respect to the lower frame portion of the module and thus is disposed substantially perpendicular to the plane of the lower frame portion of the module. This substantially perpendicular configuration of the wind deflector with respect to the first plane may improve manufacturability, reduce quality related defects, and reduce cost of assembly. In FIG. 1A, solar panel 14 extends rearward to meet the top of wind deflector 70, without leaving any gaps between the solar panel and the wind deflector. In other words, a rear edge of the photovoltaic panel and a top edge of the wind deflector meet at an acute angle in the embodiment of FIG. 1A.

Figure 1B:
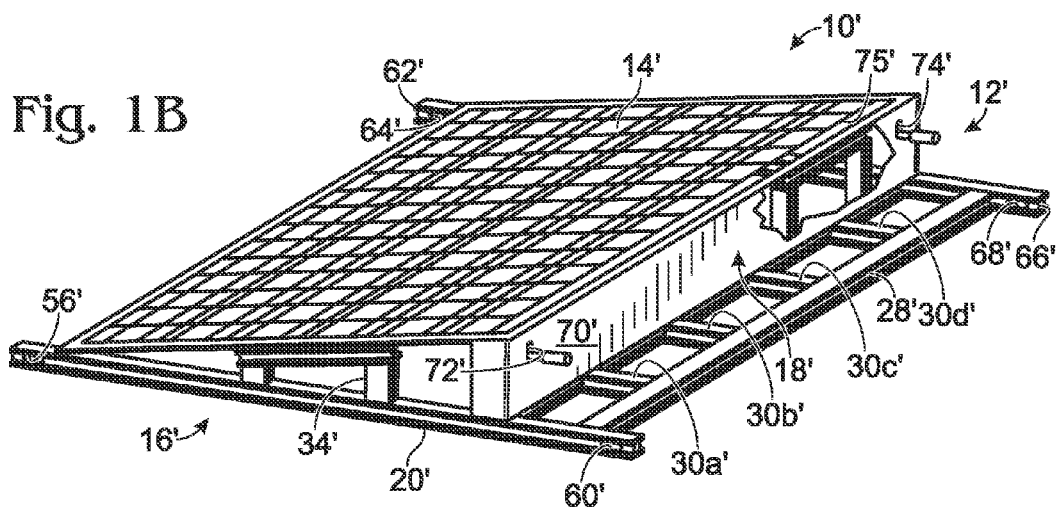
FIG. 1B is an isometric view of a variation of the module of FIG. 1A, in which a rear edge of a photovoltaic panel of the module terminates to leave a gap between the panel and a rear wind deflector of the module.

In other embodiments, the rear edge of the photovoltaic panel and the top edge of the wind deflector may not meet, but rather a small gap may be formed between the rear edge of the panel and the top edge of the deflector. For example, as depicted in FIG. 1B, the solar panel may be sized so that its rear edge terminates before reaching the plane of the wind deflector. The module of FIG. 1B is otherwise substantially identical to the module of FIG. 1A, and corresponding components are indicated with a primed reference number. In the module depicted in FIG. 1B, however, a slightly angled gap 75' (with no corresponding component in FIG. 1A) will be formed between a rear edge of the photovoltaic panel and a top edge of the wind deflector, where the gap lies in the plane of the panel.

Figure 1C:
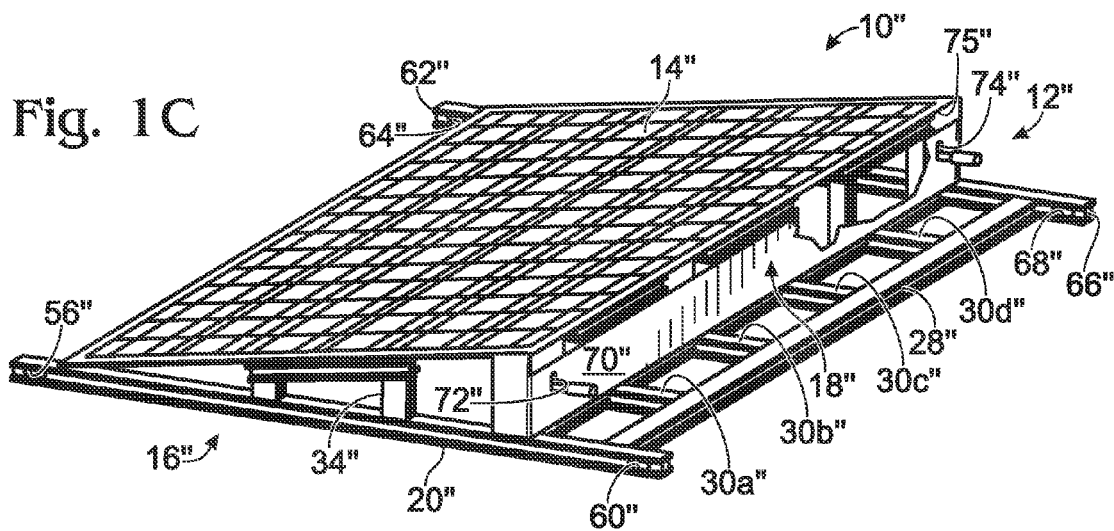
FIG. 1C is an isometric view of another variation of the module of FIG. 1A, in which a top edge of a rear wind deflector of the module terminates to leave a gap between the rear wind deflector and a photovoltaic panel of the module.

Similarly, as depicted in FIG. 1C, the solar panel may extend back to meet the plane of the wind deflector, but the top edge of the wind deflector may terminate before it meets the solar panel. The module of FIG. 1C is otherwise substantially identical to the modules of FIGS. 1A and 1B, and corresponding components are indicated with a double primed reference number. In the module depicted in FIG. 1C, however, a substantially vertical gap 75" will be formed between the rear edge of the photovoltaic panel and the top edge of the wind deflector. If both the wind deflector and the solar panel terminate before reaching their line of intersection, an angled gap will be formed between their terminal edges. In any case, a gap between the rear edge of the photovoltaic panel and the top edge of the wind deflector may act as a chimney to vent hot air generated by the solar panel.

In still other embodiments, the wind deflector may be mounted at an acute angle, with or without a gap formed between the top of the deflector and the solar panel. Regardless of the size of the solar panel or the orientation of the wind deflector, cut-outs at the top of the wind deflector (not shown) also may facilitate a chimney or venting effect.

As is also depicted, for example, in FIG. 1A and FIGS. 9-12, wind deflector 70 includes a left wiring aperture 72 and a right wiring aperture 74, each of which is configured to allow passage of a wire for forming an electrical connection between module 10 and an adjacent, substantially similar module. FIGS. 9-12 show an electrical connection being made between two laterally adjacent modules 10a and 10b. As described previously, modules 10a and 10b are substantially similar or identical to module 10 described previously. Accordingly, reference numbers followed by "a" or "b" should be understood to represent components of modules 10a or 10b which are substantially similar to their counterparts in module 10.

Figure 9:
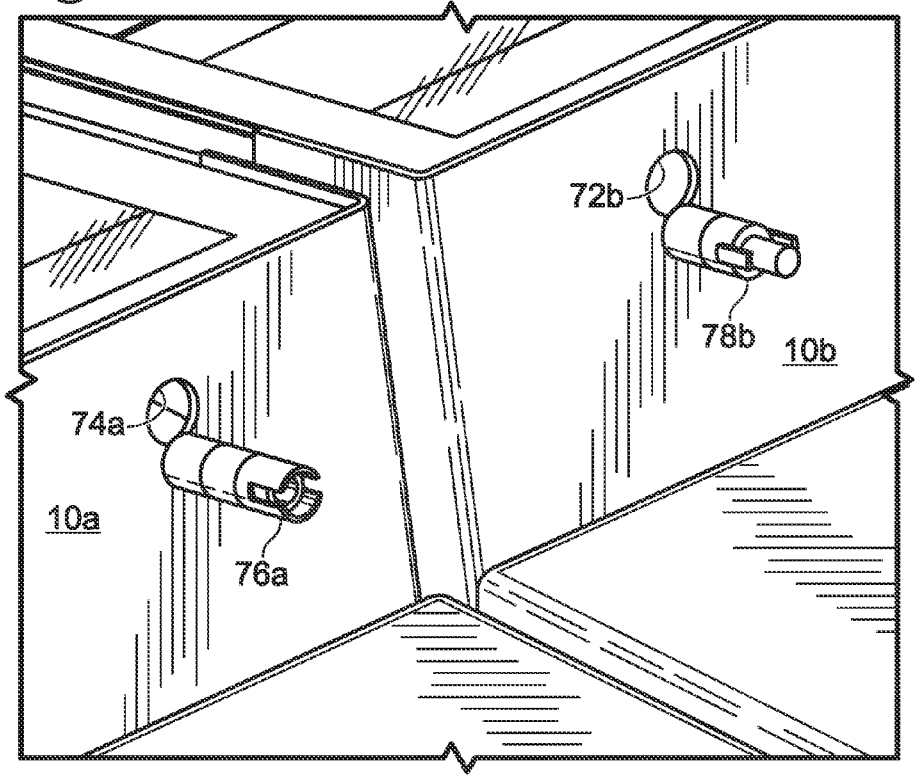
FIG. 9 is a magnified view showing portions of two laterally adjacent photovoltaic modules, including electrical connectors protruding from wiring apertures in each module.

More specifically, FIG. 9 shows an electrical connector 76a protruding from a right wiring aperture 74a of module 10a, and another electrical connector 78b protruding from a left wiring aperture 72b of module 10b. Connector 76a is shown as a "female" connector and connector 78b is shown with a "male" connector, but this choice is arbitrary and could be reversed. More generally, many different types of electrical connectors may be used. The configuration shown in FIG. 9, where only the electrical connectors protrude from the wiring apertures, could represent one desirable configuration for transporting modules 10a and 10b to a customer or to an installation location.

Figure 10:
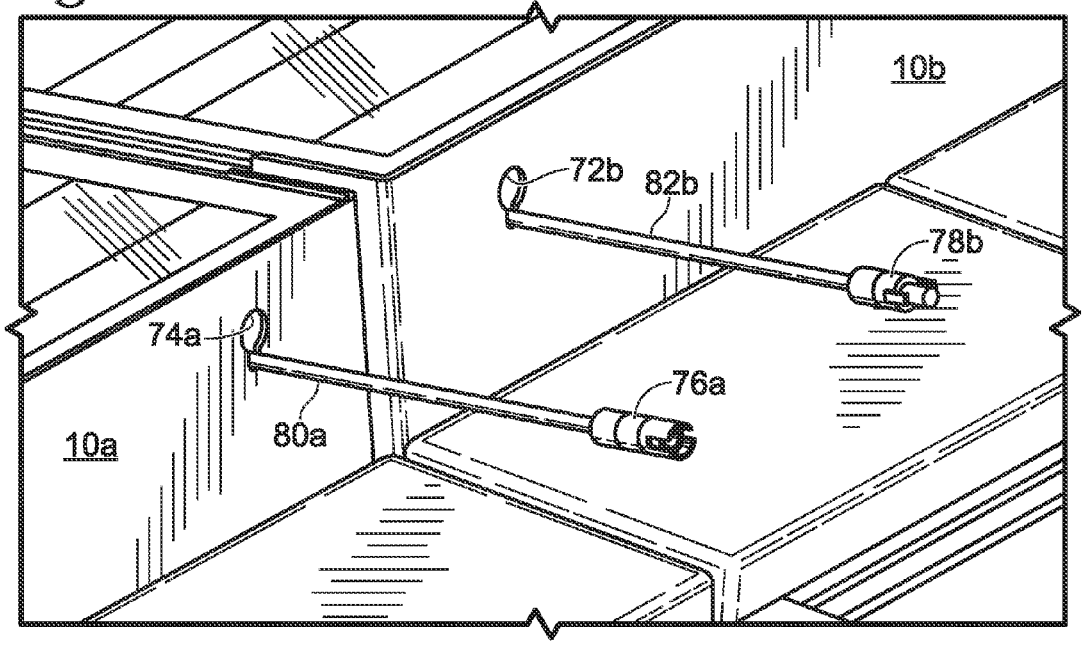
FIG. 10 shows the two laterally adjacent modules of FIG. 9, where the electrical connectors have been pulled out of their associated apertures, so that portions of their associated wires are exposed.
Figure 11:
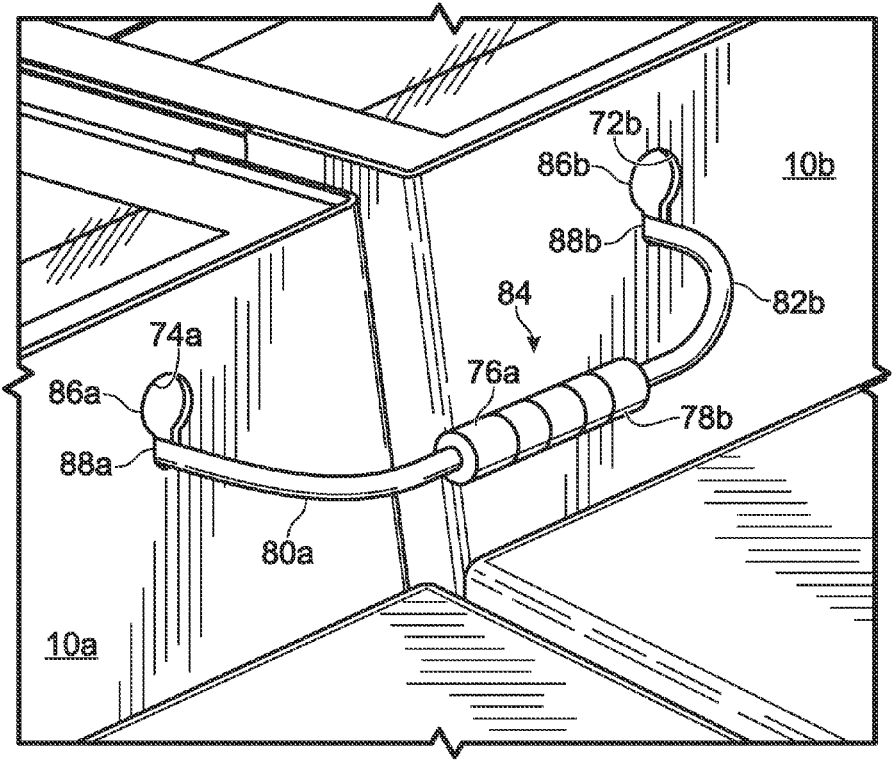
FIG. 11 shows the two laterally adjacent modules of FIGS. 9-10, where the electrical connectors have been joined together to form an electrical junction so that the modules are electrically connected.

FIG. 10 shows a configuration in which connectors 76a and 78b have been pulled out of their respective wiring apertures, so that a portion of associated wires 80a and 82b have also been pulled through the apertures. These wires would have been recessed and stored inside modules 10a and 10b prior to being pulled through the apertures. FIG. 11 shows a configuration in which an electrical connection, such as a series connection or a parallel connection, has been made between modules 10a and 10b, by joining together connectors 76a and 78b to form an electrical junction, generally indicated at 84.

Figure 12:
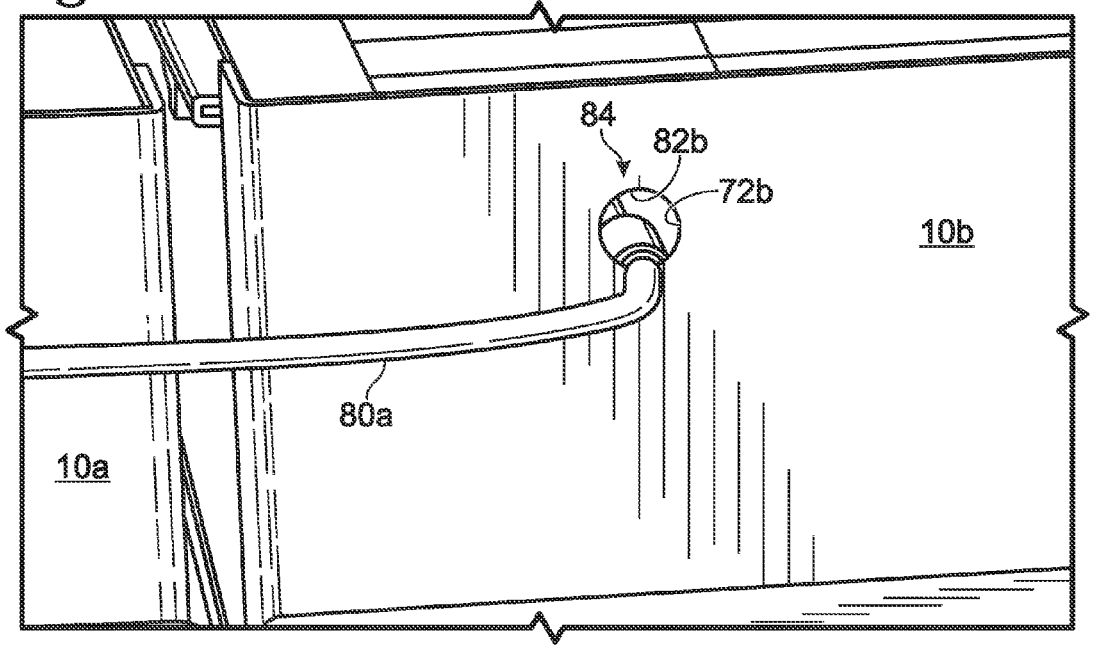
FIG. 12 shows the two laterally adjacent modules of FIGS. 9-11, where the electrical junction has been recessed within the right-hand module.

FIG. 12 shows a configuration in which connectors 76a and 78b, along with wire 82b, all have been recessed within module 10b by passing them through wiring aperture 72b. This represents one possible desirable configuration after modules 10a and 10b have been installed on a surface such as a rooftop.

As can be seen, for example, in FIG. 11, wiring apertures 74a and 72b each include an upper portion 86a, 86b configured to allow passage of a connecting wire and an electrical connector, and a lower portion 88a, 88b configured to prevent passage of the electrical connector. Furthermore, the lower portions of the wiring apertures, but not the upper portions of the apertures, may be configured to provide substantial friction to wires 80a and 82b, so that the wires can only be moved easily when they are manually moved upward and into the upper portions of the apertures. In other words, the upper portion of each of the wiring apertures may be configured to allow passage of a connecting wire substantially without friction, and the lower portion of each of the wiring apertures may be configured to hold the wire in place and to prevent the wire from slipping without manual assistance.

The wiring arrangement allows quick interconnection in the field, because either connector may be easily obtained by pulling it up and out of its keyhole-shaped aperture. Furthermore, each of the configurations depicted in FIGS. 9-12 may be a stable configuration, in which connectors 76a, 78b and wires 80a, 82b are unlikely to change positions without manual intervention.

Figure 13:
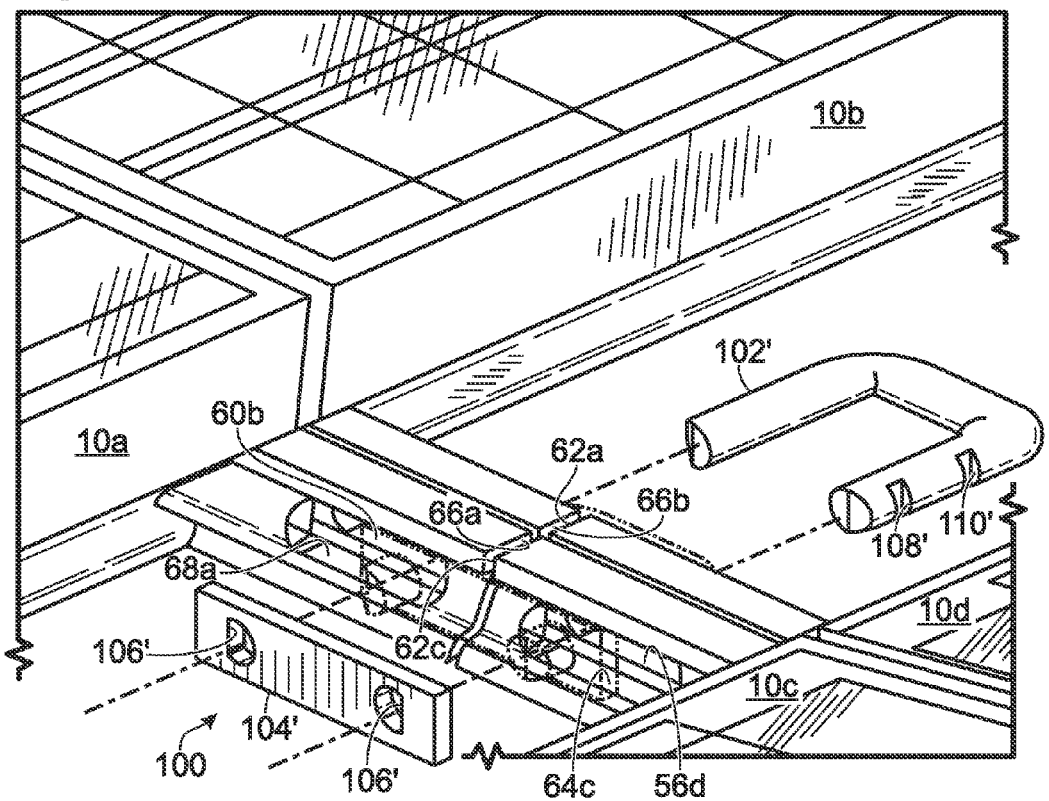
FIG. 13 depicts a u-shaped connection member being used to join together four photovoltaic modules, according to aspects of the present teachings.

FIG. 13 depicts intersection region 100 of modules 10a, 10b, 10c and 10d, where an alternative connection member in the form of a u-shaped bolt (or "u-bolt") 102' is used to interconnect the modules. U-bolt 102' is configured to span an intersection region of two or more modules and is used in conjunction with a connecting plate 104', which also spans the intersection region between two or more modules. For example, as FIG. 13 depicts, u-shaped bolt 102' is configured to fit within connecting plate 104', which spans an intersection of first and second laterally aligned modules 10a and 10b with third and fourth modules 10c and 10d, which are longitudinally adjacent to modules 10a and 10b.

A pair of notches including a distal notch 108' and a proximal notch 110' is formed in each side or "leg" portion of the u-bolt, to engage complementary apertures 106' in the connecting plate. Thus, the leg portions of u-bolt 102' may be passed through apertures 68a, 60b, 64c and 56d of modules 10a, 10b, 10c and 10d respectively, and one of notches 108', 110' on each side of the u-bolt may be engaged with apertures 106'. In some cases, a second connecting plate 104' may be used on the other side of the intersection region, in which case the distal connecting plate (relative to the u-bolt) will engage outer or distal notches 108', and the proximal connecting plate will engage inner or proximal notches 110'.

When the u-bolt is used to interconnect exactly two longitudinally adjacent and laterally aligned modules (not shown) rather than four modules, such as at the left or right edges of an assembly of modules, the connection member is configured to pass through one of the front apertures of the first module and an adjacent rear aperture of the second module. In that case, relatively less of the leg portions of the u-bolt will be disposed within the apertures of the module frame side members, and inner or proximal notches 110' will typically engage apertures 106' of the connecting plate. Furthermore, the u-bolt may be shaped so that its two distal end portions are set slightly wider apart than apertures 106', so that a compressive force is needed to insert the u-bolt into the connecting plate. Similarly, a compressive will then be needed to remove the u-bolt from the connecting plate, resulting in a secure connection between the u-bolt and the connecting plate.

The frame portions of modules according to the present teachings may be constructed at least in part from non-conductive, extruded materials such as wood and/or wood plastic composite (WPC) materials. A suitable material may include a combination of reclaimed wood fibers and thermoplastic polymer. For example, Fibrex® material manufactured by Andersen Corporation of Bayport, Minn. may be particularly suitable. The use of WPC materials may provide various advantages, such as lighter weight and greater resistance to corrosion, and may avoid the necessity of electrically grounding assemblies of the modules.

For similar reasons, module frame portions according to the present teachings may be more generally constructed from non-conductive, extruded materials. For example, typical plastic materials that are used in extrusion include but are not limited to: polyethylene (PE), polypropylene, acetal, acrylic, nylon (polyamides), polystyrene, polyvinyl chloride (PVC), acrylonitrile butadiene styrene (ABS) and polycarbonate. Such materials may be extruded directly into module frame portions, coextruded in multiple layers with additional materials (including nonconductive materials such as wood filler), or mixed with additives to be extruded as a compound. In any case, the extruded frame portions may be relatively light weight and strong, and may not require electrical grounding when assembled into one or more module frames.

A frame may be assembled according to the present teachings, for example, by heat welding a plurality of WPC frame members into a frame structure configured to provide a flat base at the bottom and an angled top mounting surface, as described previously. For example, the frame members may include first and second side members and a rear cross member that collectively define a first (bottom) plane, and first and second side support members and a rear support member that collectively define a second (mounting) plane. In this case, the first and second side support members may be heat welded to the first and second side members, respectively, and the rear support member may be heat welded to the rear cross member.

As described previously, according to the present teachings a module frame may include a front cross member including a top surface lying substantially within the second or mounting plane, to facilitate mounting of a photovoltaic panel. A laminated PV sheet may be bonded to the top of the mounting surface to create an integrated module, for example using a suitable adhesive. A wind deflector according to the present teachings may be constructed, for example, from ABS plastic or some other suitable, non-corrosive material. Extruded, non-conductive frame members also may include other desirable mounting features. For example, the first and second side members each may include a leading edge connection aperture and a trailing edge connection aperture, where the connection apertures are configured to receive a connection member for connecting the module to an adjacent, substantially similar module.

Should modules according to the present teachings need to be secured to the surface of a roof or other structure, pavers or other ballast may be disposed on a flat section of the frame structure defined by ballast support members 30a, 30b, 30c and 30d extending rearward from the wind deflector. For instance, ballast pavers (not shown) may be configured to be supported by the ballast support members of the frame and to fit securely within the spaces between the ballast support members.

Figure 14:
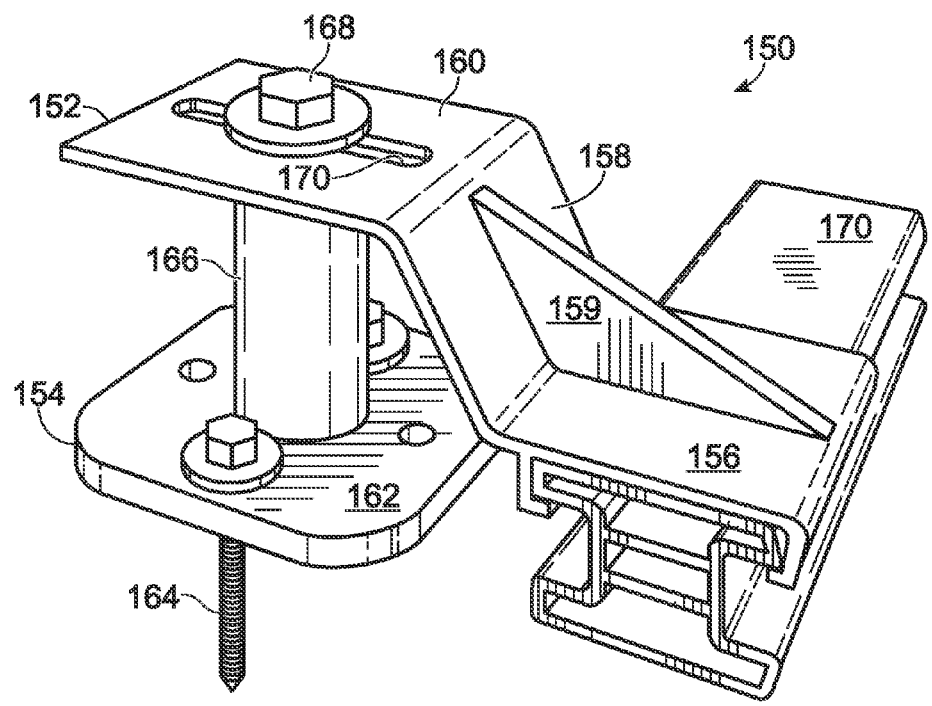
FIG. 14 depicts a hold-down mechanism in the form of a z-shaped plate and associated hardware, according to aspects of the present teachings.

In some cases, rooftop-penetrating hold-down mounts also may be used to attach the modules to a roof or to another surface such as the ground. For example, FIG. 14 depicts a hold-down mechanism, generally indicated at 150, configured to secure photovoltaic modules to a flat surface in accordance with aspects of the present teachings.

Hold-down mechanism 150 includes a z-shaped plate (or "z-plate") 152 and a compression plate assembly 154. Z-plate 152 has a lower portion 156 configured to securely engage a module frame portion such as a side member 170, for example by sliding lower portion 156 of plate 152 along the side member from one distal end to a desired location. Z-plate 152 also has an intermediate portion 158 extending diagonally upward from lower portion 156, and an upper portion 160 configured to engage compression plate assembly 154. A fin portion 159 may be formed between lower portion 156 and intermediate portion 158, to provide additional strength to the z-plate to resist deformation under load forces.

Compression plate assembly 154 includes a compression plate 162 configured to engage a flat surface, for example with penetrating members such as screws 164 that fit through apertures of the compression plate. The compression plate assembly also includes a bolt housing 166 configured to receive and securely engage a bolt 168 or other similar fastener. Bolt 168 may be passed through a slot 170 formed in upper portion 160 of the z-plate and then engaged with bolt housing 166, to securely attach z-plate 152 to compression plate assembly 154.

When (i) lower portion 156 of z-plate 152 is engaged with a photovoltaic module frame member such as side member 170, (ii) upper portion 160 of the z-plate is engaged with compression plate assembly 154, and (iii) compression plate 162 is attached to a rooftop or other flat surface by penetrating members 164, then hold-down mechanism 150 effectively attaches the photovoltaic module frame to the rooftop or other desired flat surface. With or without the addition of additional ballast, this can help an array of modules resist lift forces, such as Bernoulli-type forces resulting from wind passing over the assembly.

Figure 15:
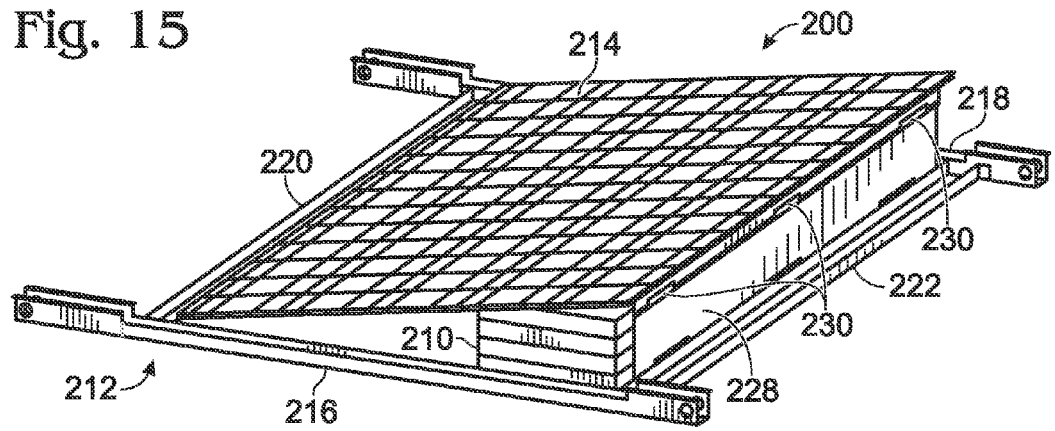
FIG. 15 is an isometric view depicting another embodiment of a photovoltaic module, according to aspects of the present teachings.
Figure 16:
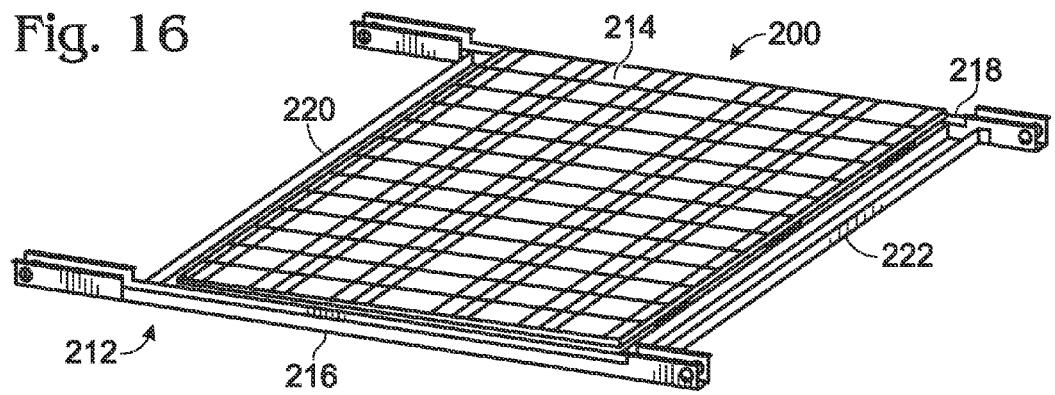
FIG. 16 depicts the module of FIG. 15 in a collapsed configuration.
Figure 17:
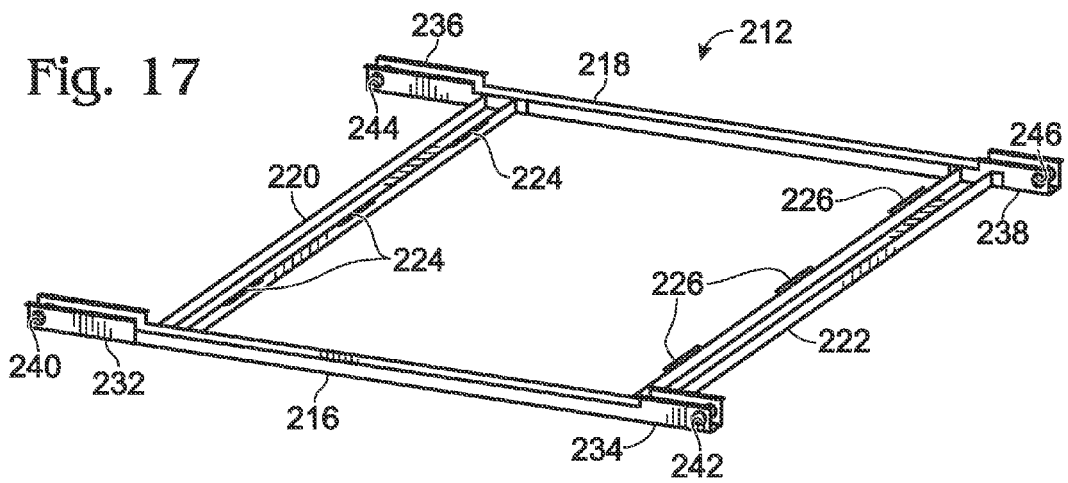
FIG. 17 depicts a frame portion of the module of FIGS. 15-16.

FIGS. 15-17 are isometric views depicting another exemplary photovoltaic module, generally indicated at 200, according to aspects of the present teachings. FIG. 15 shows module 200 in an un-collapsed or installed configuration (with ballast pavers 210 shown), FIG. 16 shows module 200 in a collapsed or shipping/storage configuration, and FIG. 17 shows just a frame portion of module 200, which is generally indicated at 212. In addition to frame portion 212, module 200 includes a photovoltaic panel 214 mounted upon or otherwise attached to the frame. Photovoltaic panel 214 may be constructed from any type of photovoltaic material, including flexible, thin-film materials and more rigid, crystalline silicon-based materials.

Frame 212 includes various support members such as side support members 216, 218, a front support member 220, and a rear support member 222. Each of these support members may have a substantially u-shaped cross section. The various support members of frame 212 may be joined together by any suitable mechanism, such as heat welding or brazing. The various support members also may include features that facilitate the attachment of panel 214 to frame 212, and/or that facilitate the interconnection of plural modules.

For example, as can be seen in FIG. 17, front support member 220 may include plural brackets 224, which are configured to receive and secure the leading edge of panel 214. Engagement of brackets 224 with the leading edge of panel 214 allows a secure connection between the panel and the frame, while still providing sufficient flexibility to allow the panel to move between an un-collapsed configuration and a collapsed configuration.

Similarly, rear support member 222 may include plural brackets 226, which are configured to receive and secure the bottom edge of a rear wind deflector 228, which is attached to panel 214 at three rotatable hinges 230. Thus, when module 200 is in its installed configuration, wind deflector 228 may be rotated into a substantially vertical orientation and its bottom edge inserted into brackets 226, whereas when module 200 is in its collapsed configuration, the bottom edge of wind deflector 228 may be removed from brackets 226 and the wind deflector may be rotated into a substantially horizontal orientation under panel 224. Of course, any ballast such as pavers 210 would not be present when module 200 is in a collapsed state.

Figure 18:
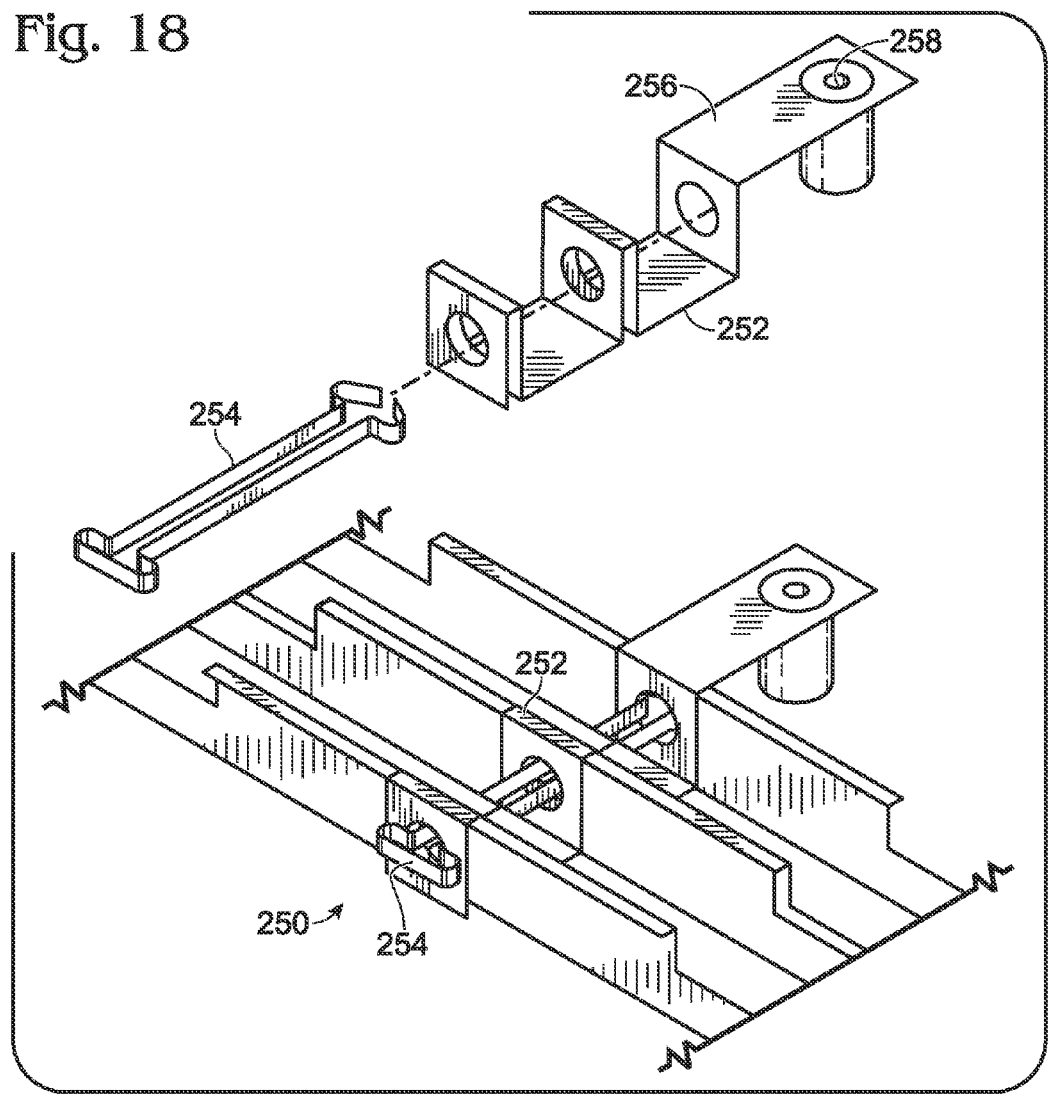
FIG. 18 depicts an interconnection mechanism and the manner in which it is configured to interconnect plural photovoltaic modules of the type shown in FIGS. 15-17, according to aspects of the present teachings.

FIGS. 15-17 also illustrate features of frame 212 that facilitate the interconnection of plural modules such as module 200, and FIG. 18 is a magnified view of an intersection region that could be formed between four substantially similar such modules. Specifically, left side member 216 includes a leading edge region 232 that is slightly narrower than trailing edge region 234, and similarly, right side member 218 includes a leading edge region 236 that is slightly narrower than trailing edge region 238. This allows the leading edges of one module frame to slide into the trailing edges of another module, as depicted in FIG. 18, which is a magnified view of an intersection region, generally indicated at 250, of four adjacent modules.

Side frame members 216 and 218 each also include apertures near their leading and trailing edges, as indicated at 240, 242, 244 and 246. Thus, as depicted in FIG. 18, adjacent modules may be positioned with the leading and trailing apertures of their respective side frame members overlapping. A connecting member 252 then may be positioned over the apertures, and a complementary cotter pin-type fastener 254 may be passed through the apertures to secure the adjacent modules together. Connecting member 252 may include an extension 256 having an aperture 258 configured to receive a penetrating member such as a screw or bolt (not shown), which may be used to attach the connecting member (and thus the modules) to a rooftop or other surface upon which the modules are mounted.

Figure 20:
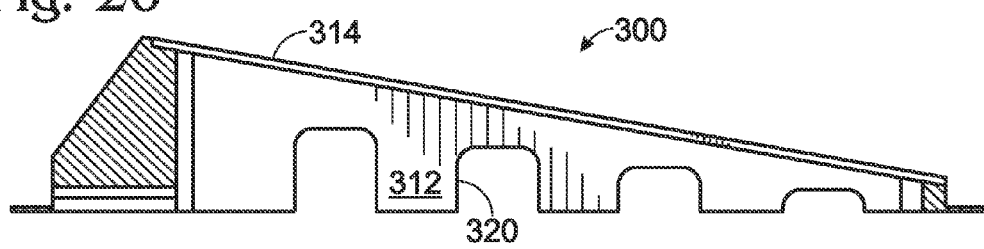
FIG. 20 depicts a sectional view of the module of FIG. 19.
Figure 19:
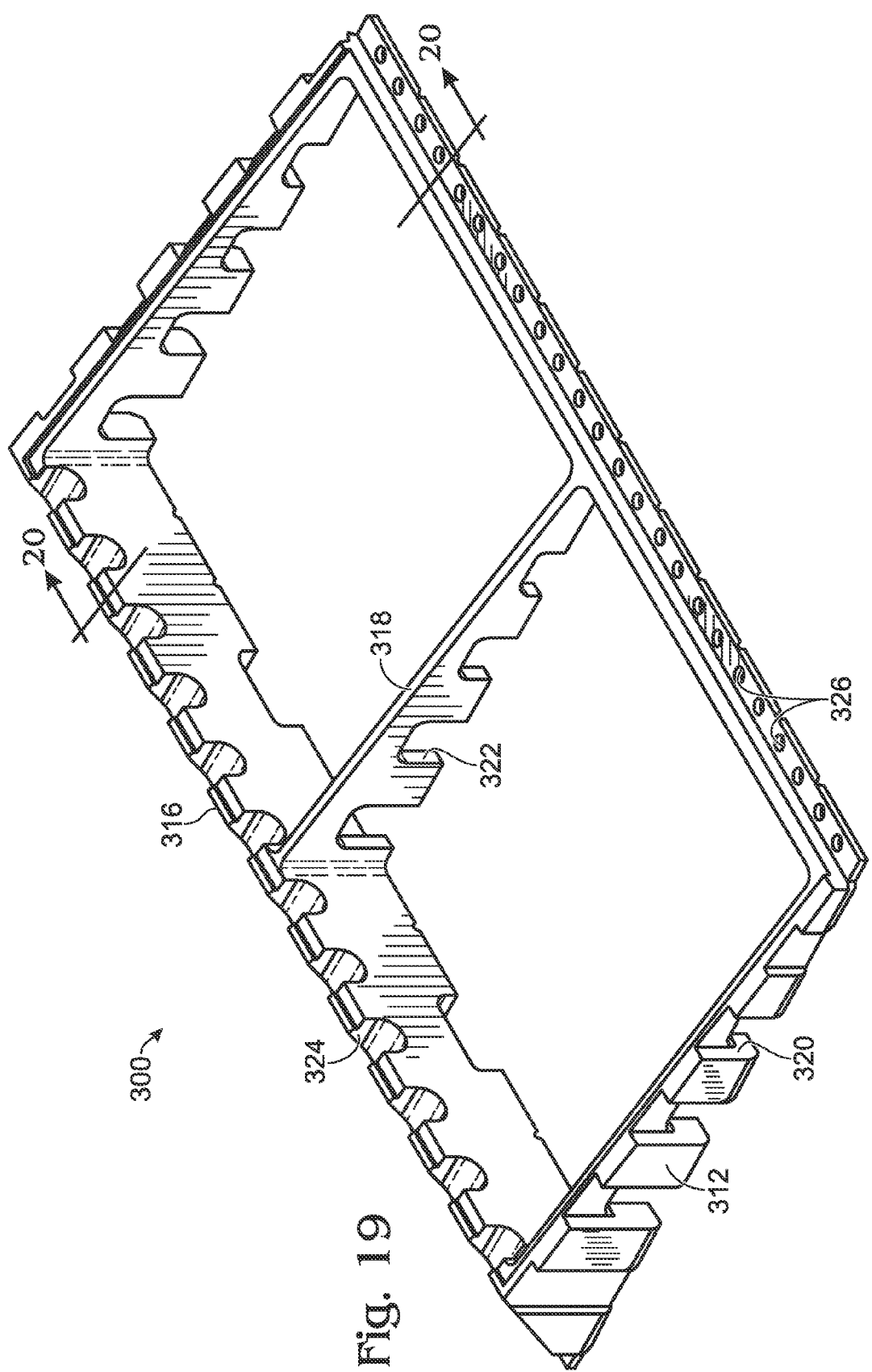
FIG. 19 is an isometric view of yet another embodiment of a photovoltaic module, according to aspects of the present teachings.

FIG. 19 is an isometric view and FIG. 20 is a sectional view of yet another embodiment of a photovoltaic module, generally indicated at 300, according to aspects of the present teachings. Module 300 generally includes a base portion 312 and a photovoltaic panel 314 (not shown in FIG. 19) mounted to the base portion. Photovoltaic panel 314 may be of any type, including the types described previously with respect to modules 100 and 200.

Base portion 312 of module 300 may be unitarily constructed, and may be formed from one or more non-conductive materials so that module 300 does not require electrical grounding. For example, the base portion may be formed from recycled rubber or the like. The base portion may include a peripheral support portion 316 and a central support portion 318, which together are configured to support panel 314. A plurality of openings 320, 322 and 324 may be formed in the base portion to reduce the weight of the base portion and to facilitate heat transfer away from the module. Apertures 326 at the leading edge of the base portion may be used to secure module 300 to an adjacent module and/or to a rooftop or other surface.

II. Methods of Installation, Assembly and Manufacture

This section describes methods of installing, assembling and manufacturing photovoltaic modules according to aspects of the present teachings; see FIGS. 21-26.

Figure 21:
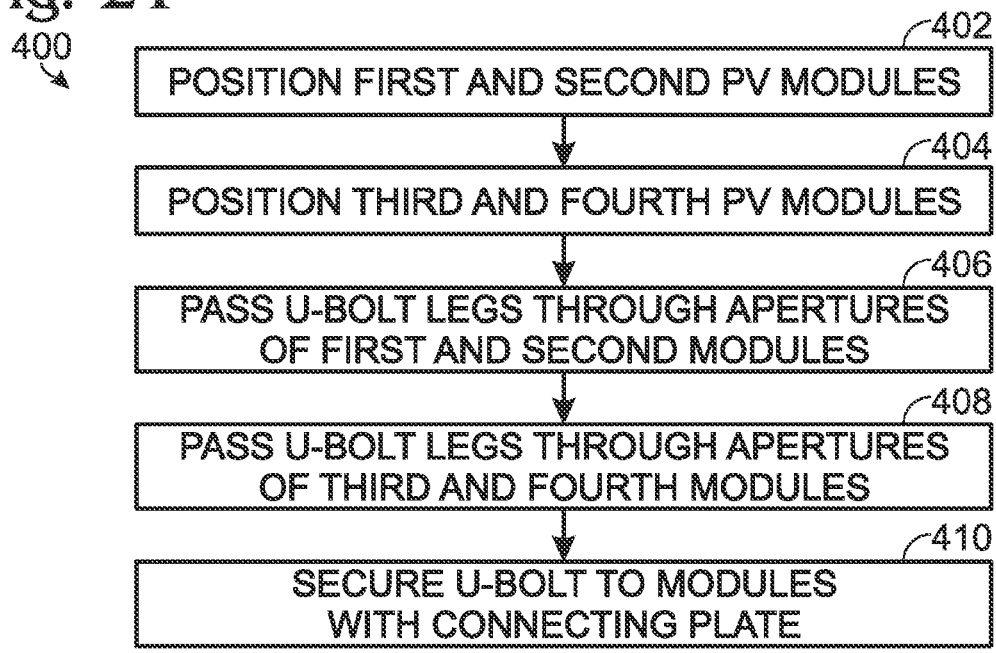
FIG. 21 is a flowchart depicting a method of installing an assembly of photovoltaic modules on a substantially flat surface, according to aspects of the present teachings.

FIG. 21 is a flowchart depicting a method, generally indicated at 400, of installing an assembly of photovoltaic modules on a substantially flat surface according to aspects of the present teachings. The modules assembled according to method 400 may be of any suitable type, including but not limited to the modules described previously in the present teachings.

At step 402, first and second photovoltaic modules are positioned to be laterally aligned and longitudinally adjacent to each other. At step 404, a third module is positioned laterally adjacent and longitudinally aligned with the first module, and a fourth module is positioned laterally adjacent and longitudinally aligned with the second module, to form an assembly of four adjacent modules. In a method involving the interconnection of just two longitudinally adjacent modules, step 404 may be omitted.

At step 406, a first leg of a u-bolt is passed through a first aperture disposed near a trailing edge of a side member of the first module and a second leg of the u-bolt is passed through a second aperture disposed near a leading edge of a side member of the second module. At step 408, which again may be omitted in a method of interconnecting just two longitudinally adjacent modules, the first leg of the u-bolt is passed through a third aperture disposed near a trailing edge of a side member of the third module and the second leg of the u-bolt is passed through a fourth aperture disposed near a leading edge of a side member of the fourth module.

At step 410, the u-bolt is secured to the first and second modules by securing the first leg and the second leg to a connecting plate that spans the leading and trailing edges of the first and second modules, respectively. When method 400 includes interconnecting four rather than just two adjacent modules, step 410 includes securing the u-bolt to the first, second, third and fourth modules by securing the first leg and the second leg to a connecting plate that spans the leading edges of the first and third modules and the trailing edges of the second and fourth modules.

The u-bolt and connecting plate used in method 400 may be of the type described previously and denoted, for example, by reference numbers 102' and 104', respectively. Accordingly, securing the first and second legs of the u-bolt to the connecting plate may include engaging a notch formed in each leg with respective first and second complementary apertures formed in the connecting plate. Furthermore, the legs of the u-bolt may be set apart from each other by a distance that exceeds the distance between the apertures of the connecting plate when the legs are in an unbiased configuration, so that the legs require compression toward each other to engage the apertures of the connecting plate. In some cases, the u-bolt assembly may be configured so that the required compression can be achieved manually, in which case modules may be attached to each other by hand and without the use of tools. In other cases, the u-bolt assembly may be configured so that a tool is generally required to achieve the desire compression, in which case a specialized compression tool may be provided.

Figure 22:
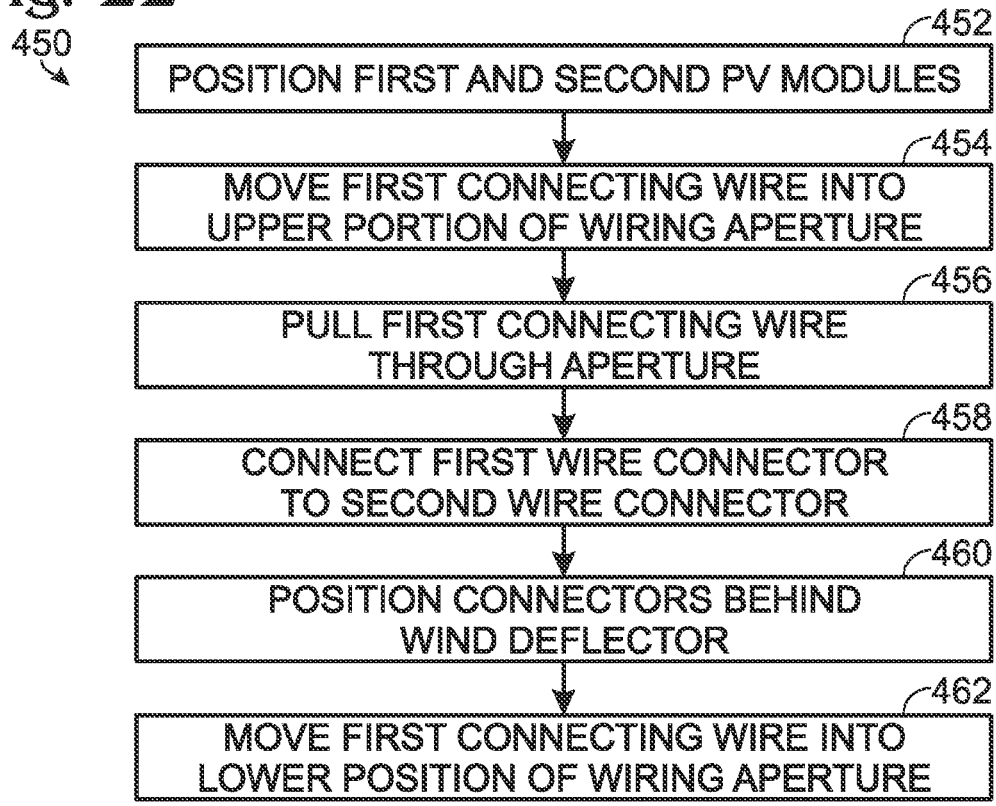
FIG. 22 is a flowchart depicting another method of installing an array of photovoltaic modules, according to aspects of the present teachings.

FIG. 22 is a flowchart depicting another method, generally indicated at 450, of installing an array of photovoltaic modules according to aspects of the present teachings. More specifically, method 450 describes the electrical interconnection of two adjacent modules. At step 452, first and second photovoltaic modules are positioned on a substantially flat surface so that the modules are longitudinally aligned with each other and laterally adjacent to each other. Each of the modules includes a rear wind deflector having at least one wiring aperture, and any of the previously described modules having a rear wind deflector with wiring apertures may be suitable for installation according to method 450. For example, suitable modules include those having left and right wiring apertures with a connecting wire disposed in each wiring aperture, where the connecting wires disposed in the left and right wiring apertures carry opposite polarity. As described above, the wiring apertures may include upper and lower portions of different sizes.

At step 454, a first connecting wire is moved into an upper portion of the wiring aperture of the first module, so that first connecting wire can move freely through the aperture. At step 456, the first connecting wire is pulled through the wiring aperture of the first module, thereby moving an electrical connector disposed at a distal end of the first wire further from the wiring aperture of the first module. At step 458, the electrical connector of the first module is connected to an electrical connector disposed at a distal end of a second connecting wire protruding from the wiring aperture of the second module, to form an electrical connection between the first and second modules.

At step 460, the first and second connecting wires are moved through the wiring apertures to position the electrical connectors behind one of the wind deflectors, after connecting the electrical connectors to each other. At step 462, the first connecting wire is moved into a lower portion of the wiring aperture(s) of the first and/or second modules so that the first connecting wire is held in place by friction. This prevents unwanted movements of the connected wires after they are connected and disposed in a desired assembled configuration.

In some installations, some of the steps above may be omitted or altered. For example, the present teachings contemplate that the connected wires may not necessarily be moved so that the electrical connectors are disposed behind one of the wind deflectors, in which case step 460 may be omitted. Similarly, in some cases the connecting wires may be held in place by means other than friction through the lower portion of the wiring aperture(s), or not held in place at all, in which case step 462 may be omitted or altered.

Figure 23:
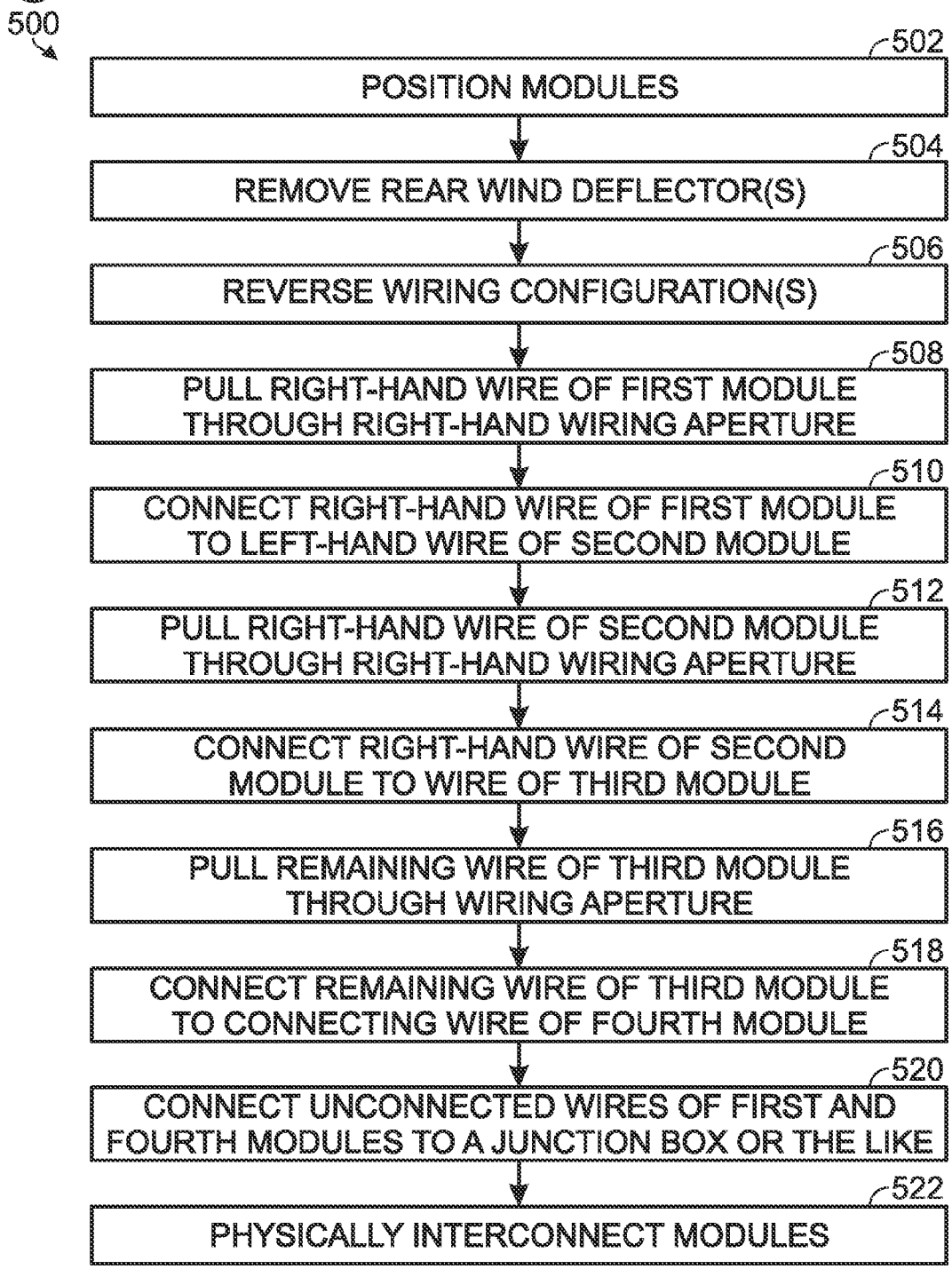
FIG. 23 is a flowchart depicting yet another method of installing an array of photovoltaic modules, according to aspects of the present teachings.

FIG. 23 is a flowchart depicting yet another method, generally indicated at 500, of installing an array of photovoltaic modules according to aspects of the present teachings. More specifically, method 500 describes the electrical interconnection of four adjacent modules. At step 502, first, second, third and fourth photovoltaic modules are positioned on a substantially flat surface so that the first and second modules are longitudinally aligned with each other and laterally adjacent to each other, the third module is laterally aligned and longitudinally adjacent to the first module, and the fourth module is laterally aligned and longitudinally adjacent to the second module. The resulting module configuration generally resembles the physical configuration depicted in FIG. 7.

At step 504, which is optional, a rear wind deflector of one or more of the modules may be removed to gain access to the connecting wires associated with that particular module. Alternatively, if step 504 is omitted, the connecting wires may be accessed through wiring apertures formed in the rear wind deflector of each module, as described previously. Also as described previously, each wiring aperture may include two aperture portions, one of which is sized to allow passage of a wire and an associated electrical connector substantially without friction, and the other of which is sized to prevent passage of the electrical connector and to hold the wire in place with friction.

At step 506, which is also optional, the wiring configuration of at least one of the modules may be reversed, for example by placing the right-hand connecting wire of the module in the left-hand wiring aperture of the module, and placing the left-hand connecting wire of the module in the right-hand wiring aperture of the module. This step may be performed, for example, to interconnect two longitudinally adjacent modules (such as at the lateral edges of an array of modules), in which case the wiring apertures of the respective modules in closest physical proximity to each other would have the same electrical polarity in the absence of reversing the wiring configuration of one of the modules.

At step 508, a right-hand connecting wire of the first module is pulled through a right-hand wiring aperture disposed in a rear wind screen of the first module. At step 510, the right-hand connecting wire of the first module is connected to a left-hand connecting wire of the second module, to form an electrical connection between the first and second modules.

At step 512, a right-hand connecting wire of the second module is pulled through a right-hand wiring aperture disposed in the rear wind screen of the second module. At step 514, the right-hand connecting wire of the second module is connected to one of the connecting wires of the third module, to form an electrical connection between the second and third modules.

If the second module is being connected to another laterally adjacent module, then at step 514 the right-hand wire of the second module will typically be connected to a left-hand wire of the third module. On the other hand, if the second module is being connected to a longitudinally adjacent module, then at step 514 the right-hand wire of the second module will typically be connected to a right-hand wire of the third module, which would therefore typically have its wiring configuration reversed so that the right-hand wires of the second and third longitudinally adjacent modules have opposite polarities.

At step 516, the remaining (unconnected) wire of the third module is pulled through a wiring aperture disposed in a rear wind deflector of the third module, and at step 518, this previously unconnected wire of the third module is connected to a connecting wire of the fourth module, to form an electrical connection between the third and fourth modules. This completes the electrical interconnection of the four modules, although additional steps may be taken to integrate the assembly of modules into an electrical system and/or to physically interconnect the modules.

For example, at step 520, the unconnected wires of the first and fourth modules may be electrically connected to a junction box, DC/AC converter, or any other device suitable for integrating power generated by the assembled modules into a household or commercial electrical grid. At step 522, the first, second, third and fourth modules may be physically interconnected, for example with a u-bolt that spans an intersection region of the modules. As described previously, a suitable u-bolt may include leg portions that are passed through connection apertures disposed in the frame portions of the modules, and into a connecting plate on the opposite side of the frame portions.

Figure 24:
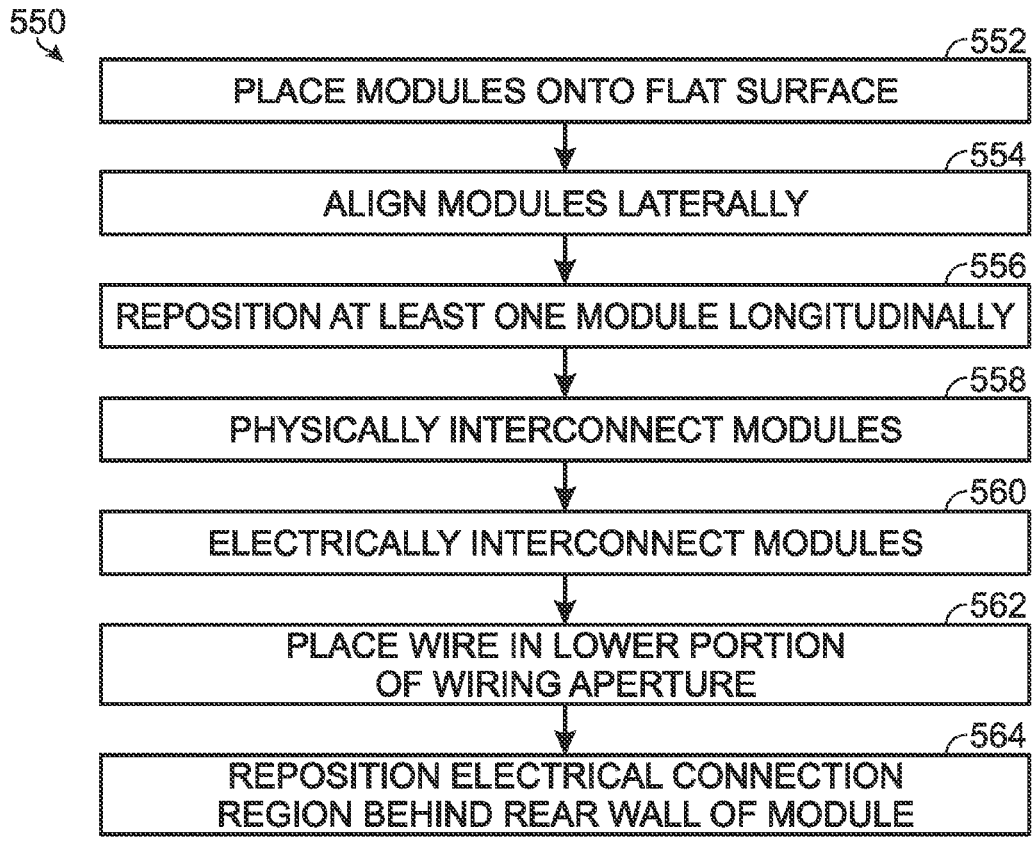
FIG. 24 is a flowchart depicting still another method of installing photovoltaic modules, according to aspects of the present teachings.

FIG. 24 is a flowchart depicting still another method, generally indicated at 550, of installing photovoltaic modules according to aspects of the present teachings. At step 552, two photovoltaic modules are placed onto a substantially flat surface such as a building rooftop or the ground. Suitable modules include, for example, any of the various modules described above or modules having similar characteristics or combinations of characteristics.

At step 554, the modules are aligned laterally, so that their respective frame side members lie approximately along the same lines. At step 556, at least one of the modules is repositioned longitudinally until a shaped leading edge of one of the modules registers with a shaped trailing edge of another one of the modules. In other words, the modules are moved toward each other until their frames mate together, indicating that they are positioned correctly. As described previously, the leading edge and trailing edge of each module define complementary shapes, such as complementary planes that are each non-perpendicular to a plane defined by the substantially flat surface, to facilitate registration of the module frames with each other.

Method 550 also may include various additional physical and/or electrical interconnection steps, such as those described previously. For instance, at step 558, the modules may be physically connected with a connection member that spans the leading edge of the rear module and the trailing edge of the front module. The connection member may, for example, be a u-bolt assembly including a u-shaped bolt and a connecting plate. In this case, physically connecting the modules includes inserting a first leg portion of the u-shaped bolt into a first aperture in the leading edge, inserting a second leg portion of the u-shaped bolt into a second aperture in the trailing edge, and engaging each leg portion with a corresponding aperture formed in a connection plate disposed on a side of the leading and trailing edges opposite a direction of insertion of the leg portions into the leading and trailing edges.

At step 560, the modules may be electrically interconnected, for instance by pulling a first connecting wire from a wiring aperture formed in a rear wall of a first of the modules, pulling a second connecting wire from a wiring aperture formed in a rear wall of a second of the modules, and connecting the wires. The wiring apertures may be substantially keyhole-shaped apertures formed in a rear wind deflector of each module, in which case method 550 may include at step 562 placing at least one of the wires into a lower portion of one of the wiring apertures to hold the wire in place with friction, after connecting the wires. At step 564, an electrical connection region of the wires may be repositioned behind one of the rear walls. This step (step 564) would typically be performed after connecting the wires at step 560 but before moving one or more wires into the lower portion of a wiring aperture at step 562.

Figure 25:
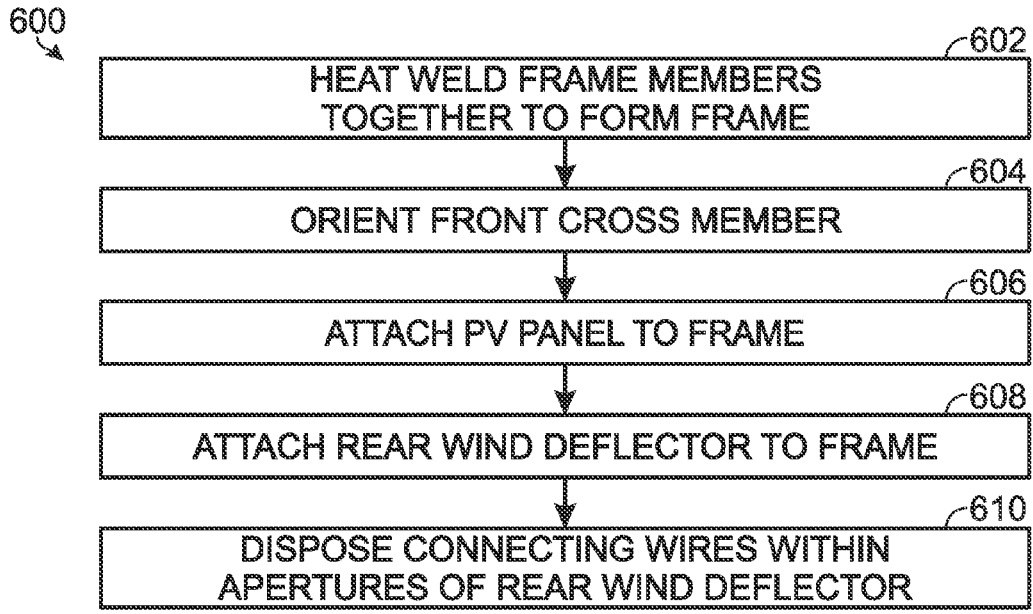
FIG. 25 is a flowchart depicting a method of assembling a photovoltaic module, according to aspects of the present teachings.

FIG. 25 is a flowchart depicting a method, generally indicated at 600, of assembling a photovoltaic module according to aspects of the present teachings. At step 602, a photovoltaic module frame is formed by heat welding a plurality of frame members together to define a first plane and a second plane oriented at a predetermined angle relative to the first plane. As described previously, the frame members may be formed from a variety of materials, including substantially electrically nonconductive materials such as a wood plastic composite material, which can be an extruded material. The frame members may be attached to each other essentially only by heat welding, or in some cases heat welding may be replaced or augmented by other attachment procedures such as adhesives or attachment hardware.

The frame members include members sufficient to rest in a stable configuration on a flat surface such as a rooftop or the ground (i.e., the first plane) and to support a photovoltaic panel in the second plane. For example, the frame members might include a pair of side members, a pair of side support members, a front cross member and a rear cross member, as described previously. At step 604, which is optional, a front cross member is oriented so that its top surface lies substantially within and helps to define the second plane. This orientation would typically be performed prior to heat welding or otherwise attaching the front cross member to any of the other frame members.

At step 606, a photovoltaic cell is attached to the frame so that the cell lies substantially within the second plane. At step 608, which is optional, a rear wind deflector is attached to the frame. At step 610, which is also optional, electrical connecting wires are disposed within first and second apertures formed in the wind deflector. Suitable photovoltaic cells, rear wind deflectors and connecting wires include any of those described previously in the present disclosure.

Figure 26:
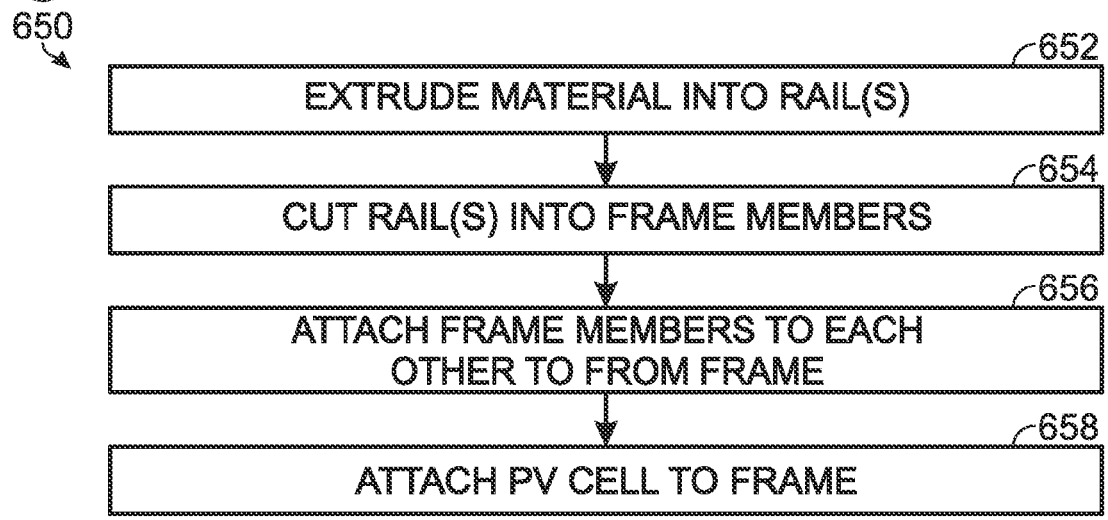
FIG. 26 is a flowchart depicting another method of assembling a photovoltaic module, according to aspects of the present teachings.

FIG. 26 is a flowchart depicting another method, generally indicated at 650, of assembling a photovoltaic module according to aspects of the present teachings. At step 652, an electrically substantially nonconductive material is extruded into one or more rails having a desired cross sectional profile. As described above, suitable materials include wood plastic composite materials such as those formed through a combination of reclaimed wood fibers and thermoplastic polymer.

At step 654, the rails are cut into a plurality of frame members sufficient to form at least a portion of a photovoltaic module frame. For example, the rails may be cut into a front cross member, a rear cross member, a pair of side members, and a pair of side support members, among others. In some cases, fewer or additional frame members may be cut, depending on the particular frame design.

At step 656, the frame members are attached to each other to form a photovoltaic module frame. The attachment of the frame members to each other may include a combination of heat welding, adhesives and/or attachment hardware, and in some cases may consist entirely (or substantially entirely) of just heat welding. This highlights an important advantage of using wood plastic composite materials, which have been found to attain a strong degree of adhesion through the use of heat welding alone. Attaching the frame members to each other typically will include forming a frame defining a first plane and a second plane oriented at a predetermined angle relative to the first plane.

At step 658, a photovoltaic cell is attached to the frame, for example through the use of adhesives and/or dedicated mounting hardware. When the frame has been formed to define two separate planes, attaching the photovoltaic cell to the frame will typically include positioning the cell to lie substantially within the second plane.

III. Additional Features and Advantages

The following, among others, are additional possible advantages of integrated PV rooftop modules and assemblies of modules according to aspects of the present teachings:

Installation throughput of module assemblies according to aspects of the present teachings may be greater than eight racks per labor hour.

Assemblies according to aspects of the present teachings may induce a maximum pressure of 2.8 lb/ft$^2$ on the roof without additional ballasting.

Modules according to aspects of the present teachings may be physically interconnected to adjacent modules to reduce the amount of required ballast.

Assemblies according to aspects of the present teachings may be electrically non-conductive and therefore may not require grounding.

Assemblies according to aspects of the present teachings may not require any specialized tools to install.

Each solar panel of modules according to aspects of the present teachings may be fully integrating into the racking structure, such that no assembly of an individual module may be required.

The following numbered paragraphs further describe aspects of the present teachings:

A. A photovoltaic assembly comprising at least a first photovoltaic module, the module including:
  a first frame portion defining a first plane and having:
   a. left and right side members, each side member including a leading edge, a front aperture disposed near the leading edge, a trailing edge, and a rear aperture disposed near the trailing edge;
   b. a front cross member connecting the left and right side members; and
   c. a rear cross member connecting the left and right side members;
  a second frame portion defining a second plane oriented at a predetermined angle relative to the first plane, the second frame portion having left and right support members, each support member connected to one of the side members and including an upper surface lying substantially within the second plane; and
  a photovoltaic panel supported by the upper surfaces of the left and right support members and lying substantially within the second plane;
  wherein the front and rear apertures of each side member are configured to receive a connection member for securing the first module to an adjacent module.

A1. The assembly of paragraph A, further comprising a second photovoltaic module substantially similar to the first module, wherein the second module is disposed laterally adjacent to and longitudinally aligned with the first module, and wherein the first and second modules are secured together with a first connection member passing through one of the rear apertures of the first module and an adjacent rear aperture of the second module.

A2. The assembly of paragraph A1, wherein the first and second modules are further secured together with a second connection member passing through one of the front apertures of the first module and an adjacent front aperture of the second module.

A3. The assembly of paragraph A1, wherein the first connection member is a self-connecting strap forming a loop that connects the first and second modules.

A4. The assembly of paragraph A1, wherein the first connection member is a u-shaped bolt configured to fit within a receiving plate which spans an intersection region of the first and second modules with third and fourth longitudinally adjacent modules.

A5. The assembly of paragraph A, further comprising a second photovoltaic module substantially similar to the first module, wherein the second module is disposed longitudinally adjacent to and laterally aligned with the first module, and wherein the first and second modules are secured together with a connection member passing through one of the front apertures of the first module and an adjacent rear aperture of the second module.

A6. The assembly of paragraph A5, wherein the first connection member is a u-shaped bolt configured to fit within a receiving plate which spans an intersection region of the first and second modules.

A7. The assembly of paragraph A, further comprising second, third and fourth photovoltaic modules, all substantially similar to the first module, wherein the second module is disposed laterally adjacent to and longitudinally aligned with the first module, the third module is disposed longitudinally adjacent to and laterally aligned with the first module, and the fourth module is disposed laterally adjacent to and longitudinally aligned with the third module and longitudinally adjacent to and laterally aligned with the second module; and
  wherein the first, second, third and fourth modules are secured together with a connection member passing through one of the rear apertures of the first module, a rear aperture of the second module which is adjacent to the rear aperture of the first module, a front aperture of the third module which is adjacent to the rear aperture of the first module, and a front aperture of the fourth module which is adjacent to the front aperture of the third module.

A8. The assembly of paragraph A, wherein the front cross member has a top surface angled to lie substantially within the second plane and which partially supports the photovoltaic panel.

A9. The assembly of paragraph A, wherein the second frame portion further includes at least one rear support member having a top surface angled to lie substantially within the second plane and which partially supports the photovoltaic panel.

A10. The assembly of paragraph A, wherein the leading edge of each side member has a shape complementary to a shape of the trailing edge of each side member.

B. A photovoltaic module, comprising:
  a frame including a first portion having right and left side members defining a first plane and a second portion defining a second plane oriented at a predetermined angle relative to the first plane;
  a photovoltaic panel supported by the second portion of the frame and lying substantially within the second plane;
  wherein the right and left side members of the first portion of the frame each include at least one aperture configured to receive a connection member for securing the module to an adjacent, substantially similar module.

B1. The photovoltaic module of paragraph B, wherein the at least one aperture includes a front aperture disposed near a leading edge of the associated side member, and a rear aperture disposed near a trailing edge of the associated side member.

B2. The photovoltaic module of paragraph B, wherein the connection member is a u-bolt configured to secure the module to an adjacent module by passing leg portions of the u-bolt through aligned apertures in adjacent side members of the modules from one side of the side members, and then engaging notches disposed in the leg portions with complementary apertures of a receiving plate disposed on the other side of the side members.

B3. The photovoltaic module of paragraph B2, wherein the leg portions of the u-bolt include a pair of inner notches configured to engage the complementary apertures of the receiving plate when the u-bolt is used to secure exactly two laterally aligned adjacent modules, and a pair of outer notches configured to engage the complementary apertures of the receiving plate when the u-bolt is used to secure four adjacent modules.

B4. The photovoltaic module of paragraph B, wherein the second portion of the frame further includes a front cross member extending between the left and right side members and including a top surface that lies substantially within the second plane.

C. A method of installing an assembly of photovoltaic modules on a substantially flat surface, comprising:
  positioning first and second modules to be laterally aligned and longitudinally adjacent to each other;
  passing a first leg of a u-bolt through a first aperture disposed near a trailing edge of a side member of the first module and passing a second leg of the u-bolt through a second aperture disposed near a leading edge of a side member of the second module; and securing the u-bolt to the first and second modules by securing the first leg and the second leg to a connecting plate that spans the leading and trailing edges of the first and second modules, respectively.

C1. The method of paragraph C, further comprising:

positioning a third laterally adjacent and longitudinally aligned with the first module, and a fourth module laterally adjacent and longitudinally aligned with the second module, to form an assembly of four adjacent modules;

passing the first leg of the u-bolt through a third aperture disposed near a trailing edge of a side member of the third module and passing the second leg of the u-bolt through a fourth aperture disposed near a leading edge of a side member of the fourth module; and wherein securing the u-bolt includes securing the u-bolt to the first, second, third and fourth modules by securing the first leg and the second leg to a connecting plate that spans the leading edges of the first and third modules and the trailing edges of the second and fourth modules.

C2. The method of paragraph C, wherein securing the first and second legs to the connecting plate includes engaging a notch formed in each leg with respective first and second complementary apertures formed in the connecting plate.

C3. The method of paragraph C2, wherein the legs of the u-bolt are set apart from each other by a distance that exceeds the distance between the apertures of the connecting plate when the legs are in an unbiased configuration, so that the legs require compression toward each other to engage the apertures of the connecting plate.

D. A photovoltaic module, comprising:

a first frame portion defining a first plane and having:
  a. left and right side members, each side member including a leading edge and a trailing edge;
  b. a front cross member connecting the left and right side members; and
  c. a rear cross member connecting the left and right side members;

a second frame portion defining a second plane oriented at a predetermined angle relative to the first plane and having:
  a. left and right support members, each support member connected to one of the side members and including an upper surface lying substantially within the second plane; and
  b. at least one rear support member extending upward from the rear cross member and having a top surface lying substantially within the second plane;

a photovoltaic panel lying substantially within the second plane and supported by the upper surfaces of the left and right support members and by the top surface of the rear support member; and a rear wind deflector attached to one of the frame portions and including left and right wiring apertures;

wherein each wiring aperture is configured to allow passage of a wire for forming an electrical connection between the first module and an adjacent, substantially similar module.

D1. The module of paragraph D, wherein the wiring apertures each include an upper portion configured to allow passage of the wire and an electrical connector, and a lower portion configured to allow passage of the wire and to prevent passage of the electrical connector.

D2. The module of paragraph D1, wherein the upper portion of each of the wiring apertures is configured to allow passage of the wire substantially without friction, and the lower portion of each of the wiring apertures is configured to hold the wire in place and to prevent the wire from slipping without manual assistance.

D3. The module of paragraph D, wherein the rear wind deflector is disposed substantially perpendicular to the first plane, and wherein a rear edge of the photovoltaic panel and a top edge of the wind deflector meet at an acute angle.

D4. The module of paragraph D, wherein the rear wind deflector is disposed substantially perpendicular to the first plane, and wherein a rear edge of the photovoltaic panel terminates before reaching a top edge of the wind deflector, to form a gap lying substantially within the second plane, between the rear edge of the photovoltaic panel and the top edge of the wind deflector.

D5. The module of paragraph D, wherein the rear wind deflector is disposed substantially perpendicular to the first plane, and wherein a top edge of the wind deflector terminates before reaching the second plane, to firm a substantially vertical gap between a rear edge of the photovoltaic panel and the top edge of the wind deflector.

D6. The module of paragraph D, wherein each of the side members includes a first connection aperture disposed in proximity to its leading edge and a second connection aperture disposed in proximity to its trailing edge, and wherein the connection apertures are configured to receive a connecting member for securely attaching the module to an adjacent, substantially similar module.

D7. The module of paragraph D6, wherein the connection member is a u-bolt that spans an intersection region of the modules.

E. A method of installing an array of photovoltaic modules, comprising:

positioning first and second photovoltaic modules on a substantially flat surface so that the modules are longitudinally aligned with each other and laterally adjacent to each other, wherein each module includes a rear wind deflector having at least one wiring aperture;

pulling a first connecting wire through the wiring aperture of the first module, thereby moving an electrical connector disposed at a distal end of the first wire further from the wiring aperture of the first module; and connecting the electrical connector of the first module to an electrical connector disposed at a distal end of a second connecting wire protruding from the wiring aperture of the second module, to form an electrical connection between the first and second modules.

E1. The method of paragraph E, wherein the wind deflectors of the first and second photovoltaic modules each include left and right wiring apertures with a connecting wire disposed in each wiring aperture, and wherein the connecting wires disposed in the left and right wiring apertures carry opposite polarity.

E2. The method of paragraph E, further comprising moving the first connecting wire into an upper portion of the wiring aperture of the first module so that first connecting wire can move freely through the aperture, prior to pulling the first connecting wire through the aperture.

E3. The method of paragraph E2, further comprising moving the first connecting wire into a lower portion of the wiring aperture of the first module so that the first connecting wire is held in place by friction, after pulling the first connecting wire through the aperture.

E4. The method of paragraph E, further comprising moving the first and second connecting wires through the wiring apertures and thereby positioning the electrical connectors behind one of the wind deflectors, after connecting the electrical connectors to each other.

E5. The method of paragraph E4, further comprising moving at least one of the connecting wires into a lower portion of one of the wiring apertures, so that the connecting wires are held in place by friction, after positioning the electrical connectors behind one of the wind deflectors.

F. A method of installing an array of photovoltaic modules, comprising:

positioning first, second, third and fourth photovoltaic modules on a substantially flat surface so that the first and second modules are longitudinally aligned with each other and laterally adjacent to each other, the third module is laterally aligned and longitudinally adjacent to the first module, and the fourth module is laterally aligned and longitudinally adjacent to the second module;

pulling a right-hand connecting wire of the first module through a right-hand wiring aperture disposed in a rear wind deflector of the first module;

connecting the right-hand connecting wire of the first module to a left-hand connecting wire of the second module, to form an electrical connection between the first and second modules;

pulling a right-hand connecting wire of the second module through a right-hand wiring aperture disposed in the rear wind deflector of the second module;

connecting the right-hand connecting wire of the second module to a first connecting wire of the third module, to form an electrical connection between the second and third modules;

pulling a second connecting wire of the third module through a wiring aperture disposed in a rear wind deflector of the third module; and connecting the second connecting wire of the third module to a connecting wire of the fourth module, to form an electrical connection between the third and fourth modules.

F1. The method of paragraph F, further comprising physically interconnecting the first, second, third and fourth modules with a u-bolt that spans an intersection region of the modules.

F2. The method of paragraph F1, wherein leg portions of the u-bolt pass through connection apertures disposed in the frame portions of the modules, and into a connecting plate.

F3. The method of paragraph F, wherein each wiring aperture includes two aperture portions, one of which is sized to allow passage of a wire and an associated electrical connector substantially without friction, and the other of which is sized to prevent passage of the electrical connector and to hold the wire in place with friction.

F4. The method of paragraph F, further comprising reversing the wiring configuration of at least one of the modules, by placing the right-hand connecting wire of the module in the left-hand wiring aperture of the module, and placing the left-hand connecting wire of the module in the right-hand wiring aperture of the module.

F5. The method of paragraph F4, further comprising removing the wind deflector of the at least one module to gain access to the connecting wires.

G. A photovoltaic module comprising:

a first frame portion defining a first plane and including:
  a. left and right side members, each side member having a leading edge and a trailing edge; and
  b. at least one cross member connecting the left and right side members;

a second frame portion defining a second plane oriented at a predetermined angle relative to the first plane, the second frame portion including left and right support members, each support member connected to one of the side members and having an upper surface lying substantially within the second plane; and a photovoltaic panel fixedly attached to the upper surfaces of the left and right support members and lying substantially within the second plane;

wherein each leading edge is configured to be connected to a leading edge of a laterally adjacent module and a trailing edge of a longitudinally adjacent module, and each trailing edge is configured to be connected to a trailing edge of a laterally adjacent module and a leading edge of a longitudinally adjacent module.

G1. The module of paragraph G, wherein each leading edge has a shape complementary to a shape of each trailing edge.

G2. The module of paragraph G1, wherein each leading edge defines a leading edge plane angled at a non-perpendicular angle relative to the first plane, and each trailing edge defines a trailing edge plane angled at 180 degrees minus the angle of the leading edge plane relative to the first plane.

G3. The module of paragraph G, wherein each leading edge includes a leading edge connection aperture, each trailing edge includes a trailing edge connection aperture, and each connection aperture is configured to receive a connection member configured to connect together at least two adjacent side members.

G4. The module of paragraph G3, wherein the connection member is a self-connecting strap configured to pass through adjacent apertures of two laterally adjacent side members and form a loop.

G5. The module of paragraph G3, wherein the connection member is a u-bolt including leg portions configured to pass through adjacent apertures of two longitudinally adjacent side members and then through a connecting plate that spans an intersection region of the longitudinally adjacent side members.

G6. The module of paragraph G5, wherein the leg portions each include a proximal notch and a distal notch, and wherein each notch is configured to engage a complementary aperture in the connecting plate.

G7. The module of paragraph G6, wherein the proximal notches are configured to engage the connecting plate when the u-bolt connects exactly two longitudinally adjacent modules, and the distal notches are configured to engage the connecting plate when the u-bolt connects two pairs of longitudinally adjacent modules, wherein the pairs are laterally adjacent to each other.

H. A method of installing photovoltaic modules, comprising:

placing at least two photovoltaic modules onto a substantially flat surface;

aligning the modules laterally; and repositioning at least one of the modules longitudinally until a shaped leading edge of one of the modules registers with a shaped trailing edge of another one of the modules.

H1. The method of paragraph H, wherein the leading edge and the trailing edge define complementary planes that are each non-perpendicular to a plane defined by the substantially flat surface.

H2. The method of paragraph H, further comprising physically connecting the modules with a connection member that spans the leading edge and the trailing edge.

H3. The method of paragraph H2, wherein the connection member is a u-bolt assembly including a u-shaped bolt and a connecting plate, and wherein physically connecting the modules includes:
  a. inserting a first leg portion of the u-shaped bolt into a first aperture in the leading edge, and inserting a second leg portion of the u-shaped bolt into a second aperture in the trailing edge; and b. engaging each leg portion with a corresponding aperture formed in a connection plate disposed on a side of the leading and trailing edges opposite a direction of insertion of the leg portions into the leading and trailing edges.

H4. The method of paragraph H2, further comprising electrically connecting the modules by pulling a first connecting wire from a wiring aperture formed in a rear wall of a first of the modules, pulling a second connecting wire from a wiring aperture formed in a rear wall of a second of the modules, and connecting the wires.

H5. The method of paragraph H4, wherein the wiring apertures are substantially keyhole-shaped apertures formed in a rear wind deflector of each module, and further comprising placing at least one of the wires into a lower portion of one of the wiring apertures to hold the wire in place with friction, after connecting the wires.

H6. The method of paragraph H4, further comprising repositioning an electrical connection region of the wires behind one of the rear walls, after connecting the wires.

I. A photovoltaic module comprising:

a frame defining a first plane and a second plane oriented at a predetermined angle relative to the first plane, the frame including at least left and right side members; and a photovoltaic panel fixedly attached to the frame and lying substantially within the second plane;

wherein a leading edge of each side member has a shape which is complementary to a shape of a trailing edge of each side member, so that longitudinally adjacent modules are configured to register with each other.

I1. The module of paragraph I, wherein each leading edge is oriented at a non-perpendicular angle relative to the first plane, and each trailing edge is oriented at a complementary angle relative to the first plane.

I2. The module of paragraph I, wherein each leading edge includes a leading edge connection aperture, each trailing edge includes a trailing edge connection aperture, and each connection aperture is configured to receive a connection member configured to connect together at least two adjacent side members.

I3. The module of paragraph I, further comprising a u-bolt connection member assembly configured to connect together two longitudinally adjacent side members.

I4. The module of paragraph I, further comprising a self-connecting strap assembly connection member configured to connect together two laterally adjacent side members.

J. A photovoltaic module, comprising:

a frame defining a first plane and a second plane oriented at a nonzero angle relative to the first plane; and a photovoltaic panel supported by the frame and lying substantially within the second plane;

wherein the frame is constructed from a non-conductive, extruded material.

J1. The module of paragraph J, wherein the frame is constructed from a wood plastic composite material.

J2. The module of paragraph J1, wherein the wood plastic composite material includes a combination of reclaimed wood fibers and thermoplastic polymer.

J3. The module of paragraph J, wherein the frame includes a plurality of frame members that are connected together by heat welding.

J4. The module of paragraph J3, wherein the frame includes first and second side members and a rear cross member that collectively define the first plane, and first and second side support members and a rear support member that collectively define the second plane.

J5. The module of paragraph J4, wherein the first and second side support members are heat welded to the first and second side members, respectively, and wherein the rear support member is heat welded to the rear cross member.

J6. The module of paragraph J4, wherein the frame includes a front cross member including a top surface lying substantially within the second plane.

J7. The module of paragraph J4, wherein the first and second side members each include a leading edge connection aperture and a trailing edge connection aperture, and wherein the connection apertures are configured to receive a connection member for connecting the module to an adjacent, substantially similar module.

K. A method of assembling a photovoltaic module, comprising:

forming a frame by heat welding a plurality of frame members together to define a first plane and a second plane oriented at a predetermined angle relative to the first plane; and attaching a photovoltaic cell to the frame so that the cell lies substantially within the second plane.

K1. The method of paragraph K, wherein the frame members are formed from a substantially electrically nonconductive material.

K2. The method of paragraph K1, wherein the frame members are formed from a wood plastic composite material.

K3. The method of paragraph K, wherein the frame members include at least a pair of side members, a pair of side support members, a front cross member and a rear cross member, and further comprising orienting the front cross member so that its top surface lies substantially within and helps to define the second plane.

K4. The method of paragraph K, wherein forming the frame consists essentially of heat welding the frame members together.

K5. The method of paragraph K, further comprising attaching a rear wind deflector to the frame, and disposing electrical connecting wires within first and second apertures formed in the wind deflector.

L. A method of assembling a photovoltaic module, comprising:

extruding an electrically substantially nonconductive material into rails having a desired cross sectional profile;

cutting the rails into a plurality of frame members;

attaching the frame members to each other to form a frame; and attaching a photovoltaic cell to the frame.

L1. The method of paragraph L, wherein the material is a wood plastic composite material.

L2. The method of paragraph L, wherein attaching the frame members to each other includes heat welding the frame members to each other.

L3. The method of paragraph L, wherein attaching the frame members to each other consists essentially of heat welding the frame members to each other.

L4. The method of paragraph L, wherein cutting the rails includes cutting at least a front cross member, a rear cross member, a pair of side members, and a pair of side support members.

L5. The method of paragraph L4, wherein attaching the frame members to each other includes forming a frame defining a first plane and a second plane oriented at a predetermined angle relative to the first plane, and wherein attaching the cell to the frame includes positioning the cell to lie substantially within the second plane.

Multiple examples of integrated PV rooftop modules having various features have been described and depicted in this disclosure. These features may be interchanged to produce other examples of integrated PV rooftop modules according to the present teachings. Many combinations of features are possible and are within the scope of the present teachings.

We claim:

1. A method of installing an assembly of photovoltaic modules on a substantially flat surface, comprising:
   positioning first and second modules to be laterally aligned and longitudinally adjacent to each other;
   passing a first leg of a u-bolt through a first aperture disposed near a trailing edge of a side member of the first module and passing a second leg of the u-bolt through a second aperture disposed near a leading edge of a side member of the second module; and
   securing the u-bolt to the first and second modules by securing the first leg and the second leg to a connecting plate that spans the leading and trailing edges of the first and second modules, respectively.

2. The method of claim 1, further comprising:
   positioning a third laterally adjacent and longitudinally aligned with the first module, and a fourth module laterally adjacent and longitudinally aligned with the second module, to form an assembly of four adjacent modules;
   passing the first leg of the u-bolt through a third aperture disposed near a trailing edge of a side member of the third module and passing the second leg of the u-bolt through a fourth aperture disposed near a leading edge of a side member of the fourth module; and
   wherein securing the u-bolt includes securing the u-bolt to the first, second, third and fourth modules by securing the first leg and the second leg to a connecting plate that spans the leading edges of the first and third modules and the trailing edges of the second and fourth modules.

3. The method of claim 1, wherein securing the first and second legs to the connecting plate includes engaging a notch formed in each leg with respective first and second complementary apertures formed in the connecting plate.

4. The method of claim 3, wherein the legs of the u-bolt are set apart from each other by a distance that exceeds the distance between the apertures of the connecting plate when the legs are in an unbiased configuration, so that the legs require compression toward each other to engage the apertures of the connecting plate.

5. A photovoltaic assembly comprising at least first and second substantially similar photovoltaic modules, each module including:
   a first frame portion defining a first plane and having:
     a. left and right side members, each side member including a leading edge, a front aperture disposed near the leading edge, a trailing edge, and a rear aperture disposed near the trailing edge;
     b. a front cross member connecting the left and right side members; and
     c. a rear cross member connecting the left and right side members;
   a second frame portion defining a second plane oriented at a predetermined angle relative to the first plane, the second frame portion having left and right support members, each support member connected to one of the side members and including an upper surface lying substantially within the second plane; and
   a photovoltaic panel supported by the upper surfaces of the left and right support members and lying substantially parallel to the second plane;
   wherein the front and rear apertures of each side member are configured to receive a connection member for securing each module to an adjacent module;
   wherein the second module is disposed laterally adjacent to and longitudinally aligned with the first module, and the first and second modules are secured together with a first connection member passing through one of the rear apertures of the first module and an adjacent rear aperture of the second module; and
   wherein the first connection member is selected from the group consisting of a self-connecting strap forming a loop that connects the first and second modules, and a u-shaped bolt configured to fit within a receiving plate which spans an intersection region of the first and second modules with third and fourth longitudinally adjacent modules.

6. The assembly of claim 5, wherein the first connection member is a u-shaped bolt configured to fit within a receiving plate which spans an intersection region of the first and second modules with third and fourth longitudinally adjacent modules.

7. The assembly of claim 5, further comprising a third photovoltaic module substantially similar to the first module, wherein the third module is disposed longitudinally adjacent to and laterally aligned with the first module, and wherein the first and third modules are secured together with a second connection member passing through one of the front apertures of the first module and an adjacent rear aperture of the third module.

8. The assembly of claim 7, wherein the second connection member is a u-shaped bolt configured to fit within a receiving plate which spans an intersection region of the first and third modules.

9. The assembly of claim 5, wherein the first connection member is a self-connecting strap forming a loop that connects the first and second modules.

10. A photovoltaic assembly comprising first, second, third and fourth substantially similar photovoltaic modules, each module including:
   a first frame portion defining a first plane and having:
     left and right side members, each side member including a leading edge, a front aperture disposed near the leading edge, a trailing edge, and a rear aperture disposed near the trailing edge;
     a front cross member connecting the left and right side members; and
     a rear cross member connecting the left and right side members;
   a second frame portion defining a second plane oriented at a predetermined angle relative to the first plane, the second frame portion having left and right support members, each support member connected to one of the side members and including an upper surface lying substantially within the second plane; and
   a photovoltaic panel supported by the upper surfaces of the left and right support members and lying substantially parallel to the second plane;
   wherein the front and rear apertures of each side member are configured to receive a connection member for securing the first module to an adjacent module;
   wherein the second module is disposed laterally adjacent to and longitudinally aligned with the first module, the third module is disposed longitudinally adjacent to and laterally aligned with the first module, and the fourth module is disposed laterally adjacent to and longitudinally aligned with the third module and longitudinally adjacent to and laterally aligned with the second module; and
   wherein the first, second, third and fourth modules are secured together with a connection member passing through one of the rear apertures of the first module, a rear aperture of the second module which is adjacent to the rear aperture of the first module, a front aperture of the third module which is adjacent to the rear aperture of the first module, and a front aperture of the fourth module which is adjacent to the front aperture of the third module.

11. The assembly of claim 5, wherein the front cross member has a top surface angled to lie substantially within the second plane and which partially supports the photovoltaic panel.

12. The assembly of claim 5, wherein the second frame portion further includes at least one rear support member having a top surface angled to lie substantially within the second plane and which partially supports the photovoltaic panel.

13. The assembly of claim 5, wherein the leading edge of each side member has a shape complementary to a shape of the trailing edge of each side member.

14. The assembly of claim 10, wherein the connection member is a u-bolt configured to secure the first, second, third and fourth modules by passing leg portions of the u-bolt through aligned apertures in adjacent side members of the modules from one side of the side members, and then engaging notches disposed in the leg portions with complementary apertures of a receiving plate disposed on the other side of the side members.

15. The assembly of claim 14, wherein the leg portions of the u-bolt include a pair of inner notches configured to engage the complementary apertures of the receiving plate when the u-bolt is used to secure exactly two laterally aligned adjacent modules, and a pair of outer notches configured to engage the complementary apertures of the receiving plate when the u-bolt is used to secure four adjacent modules.

16. The assembly of claim 10, wherein each front cross member has a top surface angled to lie substantially within the second plane and which partially supports the photovoltaic panel.

17. The assembly of claim 10, wherein the connection member is a self-connecting strap forming a loop that connects the first and second modules.

18. A photovoltaic module, comprising:
a frame including a first portion having right and left side members defining a first plane and a second portion defining a second plane oriented at a predetermined angle relative to the first plane;
a photovoltaic panel supported by the second portion of the frame and lying substantially parallel to the second plane;
wherein the right and left side members of the first portion of the frame each include at least one aperture configured to receive a connection member for securing the module to an adjacent, substantially similar module;
wherein the at least one aperture includes a front aperture disposed near a leading edge of the associated side member, and a rear aperture disposed near a trailing edge of the associated side member; and
wherein the connection member is a u-bolt configured to secure the module to an adjacent module by passing leg portions of the u-bolt through aligned apertures in adjacent side members of the modules from one side of the side members, and then engaging notches disposed in the leg portions with complementary apertures of a receiving plate disposed on the other side of the side members.

19. The photovoltaic module of claim 18, wherein the leg portions of the u-bolt include a pair of inner notches configured to engage the complementary apertures of the receiving plate when the u-bolt is used to secure exactly two laterally aligned adjacent modules, and a pair of outer notches configured to engage the complementary apertures of the receiving plate when the u-bolt is used to secure four adjacent modules.

20. The photovoltaic module of claim 18, wherein the second portion of the frame further includes a front cross member extending between the left and right side members and including a top surface that lies substantially within the second plane.

* * * * *